United States Patent
Nakamura

(10) Patent No.: US 11,127,714 B2
(45) Date of Patent: Sep. 21, 2021

(54) PRINTED BOARD AND SEMICONDUCTOR DEVICE

(71) Applicant: FUJI ELECTRIC CO., LTD., Kawasaki (JP)

(72) Inventor: Hideyo Nakamura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/889,138

(22) Filed: Jun. 1, 2020

(65) Prior Publication Data

US 2021/0020603 A1 Jan. 21, 2021

(30) Foreign Application Priority Data

Jul. 19, 2019 (JP) .............................. JP2019-133361

(51) Int. Cl.
| | |
|---|---|
| *H01L 25/065* | (2006.01) |
| *H01L 23/498* | (2006.01) |
| *H01L 23/50* | (2006.01) |
| *H01L 23/538* | (2006.01) |
| *H01L 23/02* | (2006.01) |

(52) U.S. Cl.
CPC .......... *H01L 25/0655* (2013.01); *H01L 23/02* (2013.01); *H01L 23/49833* (2013.01); *H01L 23/50* (2013.01); *H01L 23/5384* (2013.01)

(58) Field of Classification Search
CPC ........... H01L 25/0655; H01L 23/49833; H01L 23/50; H01L 23/5384; H01L 23/02
See application file for complete search history.

(56) References Cited

U.S. PATENT DOCUMENTS

| | | |
|---|---|---|
| 2014/0346659 A1 | 11/2014 | Nakamura et al. |
| 2014/0346676 A1 | 11/2014 | Horio et al. |
| 2015/0223339 A1 | 8/2015 | Nakamura et al. |
| 2015/0115288 A1 | 11/2015 | Tamada et al. |
| 2016/0016475 A1 | 1/2016 | Toda et al. |

(Continued)

FOREIGN PATENT DOCUMENTS

| | | |
|---|---|---|
| JP | 2006-179732 A | 7/2006 |
| JP | 2015-41716 A | 3/2015 |

(Continued)

OTHER PUBLICATIONS

Norihiro Nashida et al., "All-SiC Module Technologies", Fuji Electric Review, 2012, vol. 85, No. 6, p. 403-407.

*Primary Examiner* — Quoc D Hoang

(57) ABSTRACT

A semiconductor device implements upper and lower arms for three phases by a plurality of semiconductor chips, an insulated circuit board, and a printed board, the printed board includes: a plurality of upper relay pattern layers arranged on one main surface of an insulating layer; an upper common pattern layer arranged on the one main surface of the insulating layer; a plurality of lower relay pattern layers arranged to be opposed to the upper relay pattern layers on another main surface opposite to the one main surface of the insulating layer; and a lower common pattern layer arranged to be opposed to the upper common pattern layer on the other main surface of the insulating layer, and control wires electrically connected to the semiconductor chips are partly provided in regions between the upper relay pattern layers and the upper common pattern layer.

10 Claims, 18 Drawing Sheets

(56) References Cited

U.S. PATENT DOCUMENTS

2017/0077068 A1 3/2017 Horio et al.
2018/0026022 A1* 1/2018 Lee .................... H01L 23/5383
                                                        257/659

FOREIGN PATENT DOCUMENTS

| JP | 2017-108187 A | 6/2017 |
| WO | 2013/118415 A1 | 8/2013 |
| WO | 2013/145619 A1 | 10/2013 |
| WO | 2013/145620 A1 | 10/2013 |
| WO | 2013/146212 A1 | 10/2013 |
| WO | 2014/061211 A1 | 4/2014 |
| WO | 2014/185050 A1 | 11/2014 |
| WO | 2014/136271 A1 | 12/2014 |

* cited by examiner

PRINTED BOARD AND SEMICONDUCTOR DEVICE

CROSS-REFERENCE TO RELATED APPLICATION

This application claims benefit of priority under 35 USC 119 based on Japanese Patent Application No. 2019-133361 filed on Jul. 19, 2019, the entire contents of which are incorporated by reference herein.

BACKGROUND

1. Field of the Invention

The present invention relates to a power semiconductor device (a semiconductor module) including an insulated circuit board equipped with power semiconductor chips and a printed board.

2. Description of the Related Art

Power semiconductor devices are known that include insulated circuit boards equipped with power semiconductor chips and printed boards.

WO 2013/118415 A1 (Patent Document 1) discloses a semiconductor device for fabricating a three-phase half bridge circuit. WO 2014/185050 A1 (Patent Document 2) discloses a semiconductor device for fabricating a single-phase half bridge circuit. JP 2015-41716 A (Patent Document 3) discloses that a coefficient of linear expansion of a sealing resin is set to be closer to those of a conductive layer and an electrode terminal than that of a substrate so as to put a higher priority on the compatibility with the conductive layer and the electrode terminal by priority.

JP 2006-179732 A (Patent Document 4) discloses an appropriate range set for a coefficient of linear expansion of epoxy resin. WO 2014/136271 A1 (Patent Document 5) discloses a power semiconductor module having a 6-in-1 structure.

JP 2017-108187 A (Patent Document 6) discloses a power semiconductor module having a 6-in-1 structure, and discloses an epoxy resin insulating sheet containing alumina powder as inorganic powder.

WO 2014/061211 A1 (Patent Document 7), WO 2013/146212 A1 (Patent Document 8), WO 2013/145619 A1 (Patent Document 9), WO 2013/145620 A1 (Patent Document 10), and NASHIDA Norihiro, HINATA Yuichiro, and HORIO Masafumi; "All-SiC Module Technologies", Fuji Electric Review, 2012, Vol. 85, No. 6, p. 403-407 (Non-Patent Document 1) disclose semiconductor modules equipped with power semiconductor chips.

The respective semiconductor devices disclosed in Patent Documents 1 to 10 and Non-Patent Document 1 fail to disclose the way of drawing of control wires (gate wires) electrically connected to the control electrodes of the semiconductor chips when implementing upper and lower arms for three phases.

SUMMARY

In view of the foregoing issue, the present invention provides a semiconductor device to implement upper and lower arms for three phases, allowing efficient drawing of control wires electrically connected to control electrodes of semiconductor chips so as to reduce floating inductance.

An aspect of the present invention inheres in a semiconductor device including: a plurality of semiconductor chips each having a control electrode; an insulated circuit board in which the plural semiconductor chips are mounted on one main surface; a printed board arranged to be opposed to the one main surface of the insulated circuit board; and a plurality of control wires each electrically connected to one of the control electrodes. Upper and lower arms for three phases are implemented by the semiconductor chips, the insulated circuit board, and the printed board. The printed board includes: an insulating layer; a plurality of upper relay pattern layers arranged on one main surface of the insulating layer; an upper common pattern layer arranged parallel to the upper relay pattern layers on the one main surface of the insulating layer; a plurality of lower relay pattern layers arranged to be opposed to the upper relay pattern layers on another main surface opposite to the one main surface of the insulating layer and individually having a potential equal to that of the corresponding upper relay pattern layers; and a lower common pattern layer arranged to parallel to the lower relay pattern layers to be opposed to the upper common pattern layer on the other main surface of the insulating layer and having a potential equal to that of the upper common pattern layer. The control wires are partly provided in regions between the upper relay pattern layers and the upper common pattern layer.

DETAILED DESCRIPTION

Figure 1:
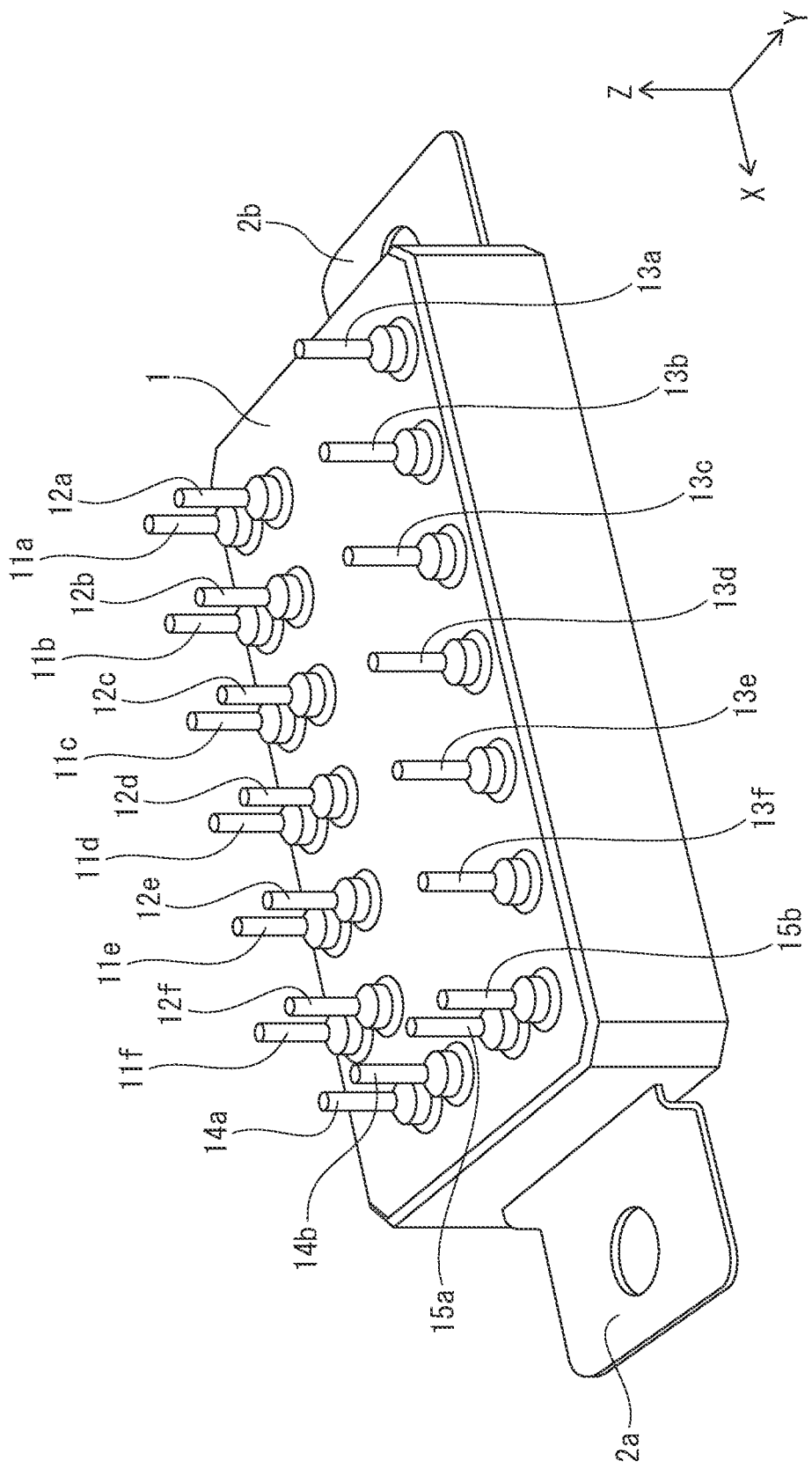
FIG. 1 is a perspective view illustrating a semiconductor device according to an embodiment on the top surface side.

With reference to the Drawings, embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

In the Specification, a "first main electrode" of a semiconductor chip (semiconductor element) means an electrode which supplies a main current for the semiconductor chip or receives the main current from the semiconductor chip. The first main electrode is assigned to an electrode which will be a source electrode or a drain electrode in a field-effect transistor (FET) or a static induction transistor (SIT), an emitter electrode or a collector electrode in an insulated-gate bipolar transistor (IGBT) and an anode electrode or a cathode electrode in a static induction (SI) thyristor or a gate turn-off (GTO) thyristor.

A "second main electrode" of the semiconductor chip is assigned to an electrode which will not be the first main electrode and will be the source electrode or the drain electrode in the FET or the SIT, the emitter electrode or the collector electrode in the IGBT, and the anode electrode or the cathode electrode in the SI thyristor or the GTO thyristor.

That is, when the first main electrode is the source electrode, the second main electrode means the drain electrode. When the first main electrode is the emitter electrode, the second main electrode means the collector electrode. When the first main electrode is the anode electrode, the second main electrode means the cathode electrode. A function of the first main electrode and a function of the second main electrode are exchangeable each other by exchanging a bias relationship if the structure of the subject semiconductor chip is symmetric such as MISFET.

Further, definitions of directions such as an up and down direction in the Specification are merely definitions for convenience of understanding, and are not intended to limit the technical ideas of the present invention. For example, "upper" and "lower" of "an upper wiring layer" and "a lower wiring layer" in the following description are selected just for convenience and are not defined relative to the direction of the earth's gravity. Therefore, as a matter of course, when the subject is observed while being rotated by 90°, the subject is understood by converting the up-and-down direction into the right-and-left direction. When the subject is observed while being rotated by 180°, the subject is understood by inverting the up-and-down direction.

<Semiconductor Device>

Figure 2:
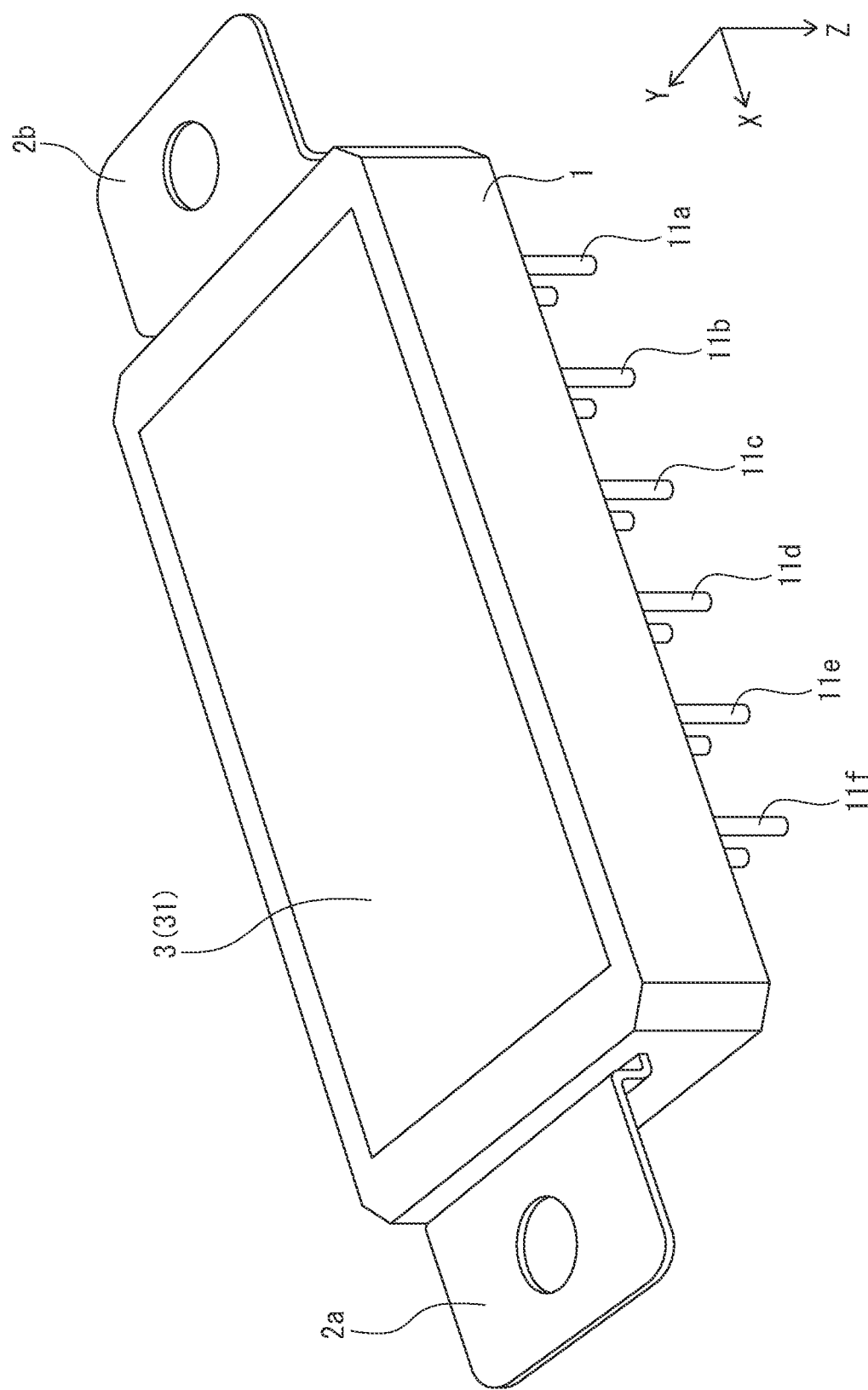
FIG. 2 is a perspective view illustrating the semiconductor device according to the embodiment on the bottom surface side.
Figure 3:
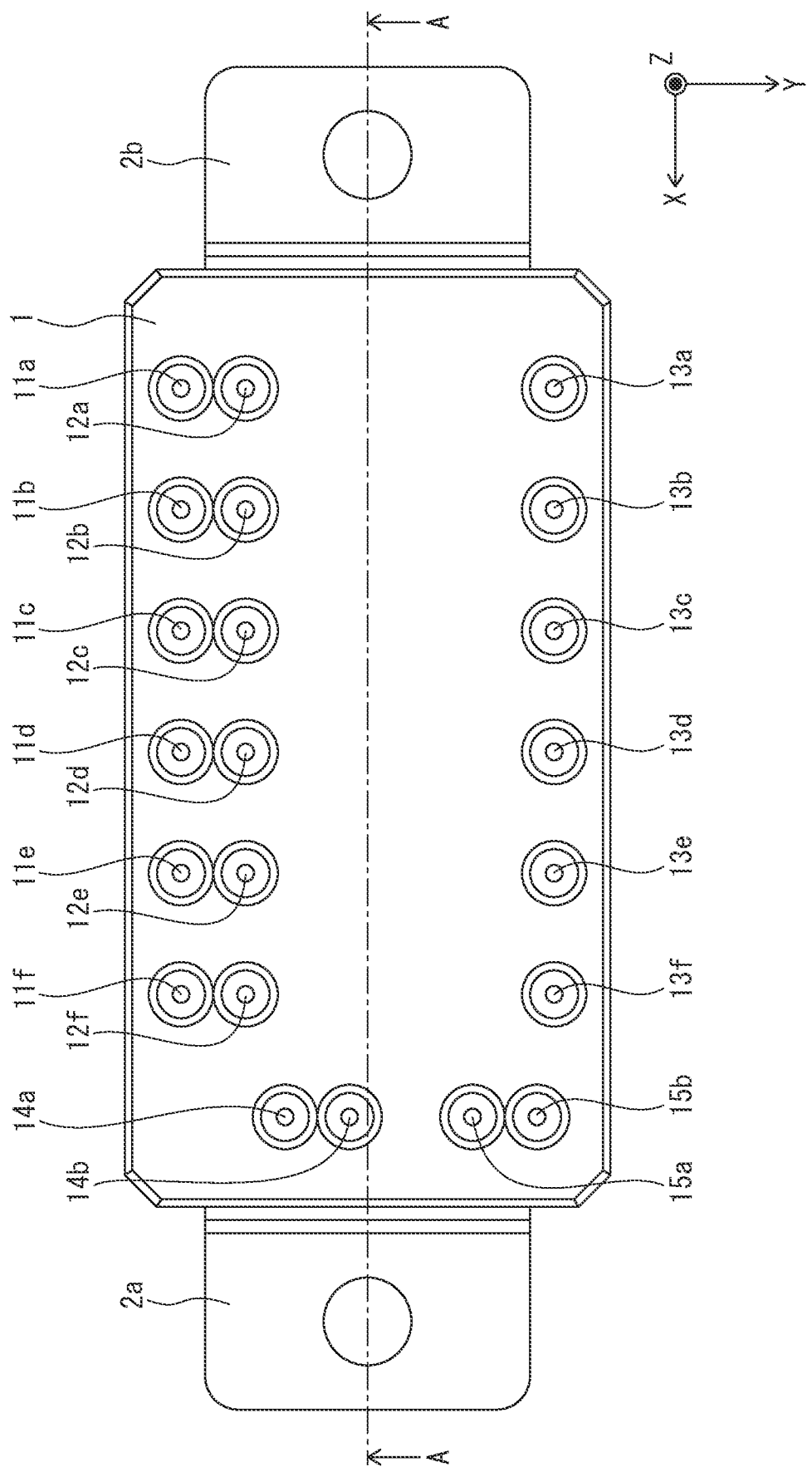
FIG. 3 is a top view of the semiconductor device according to the embodiment.

A semiconductor device (a semiconductor module) according to an embodiment includes a sealing resin 1 having a substantially cuboidal shape, and attachment flanges 2a and 2b arranged on side surfaces opposed to each other in the longitudinal direction of the sealing resin 1, as illustrated in FIG. 1 to FIG. 3. A material used for the sealing resin 1 may be a resin material such as hard thermosetting resin having high heat resistance, and specific examples include epoxy resin, maleimide resin, and cyanate resin. The attachment flanges 2a and 2b are used for attaching the semiconductor device according to the embodiment to cooling fins (not illustrated). A conductive layer 31 on the bottom surface side of an insulated circuit board 3 is exposed to the middle on the bottom surface of the sealing resin 1.

The semiconductor device according to the embodiment includes a plurality of (six) stick-like control terminals 11a, 11b, 11c, 11d, 11e, and 11f, a plurality of (six) stick-like sense terminals 12a, 12b, 12c, 12d, 12e, and 12f, a plurality of (six) output terminals 13a, 13b, 13c, 13d, 13e, and 13f, a plurality of (two) stick-like high-potential-side terminals (P terminals) 14a and 14b, and a plurality of (two) stick-like low-potential-side terminals (N terminals) 15a and 15b, each being provided to project on the top surface of the sealing resin 1. The sealing resin 1 seals these elements excluding one end of the respective output terminals 13a, 13b, 13c, 13d, 13e, and 13f, one end of the respective control terminals 11a, 11b, 11c, 11d, 11e, and 11f, one end of the respective sense terminals 12a, 12b, 12c, 12d, 12e, and 12f, one end of the respective high-potential-side terminals (P terminals) 14a and 14b, one end of the respective low-potential-side terminals (N terminals) 15a and 15b, and the bottom surface of the conductive layer 31.

The control terminals 11a to 11f are aligned in line in the longitudinal direction of the sealing resin 1. In the following descriptions of the drawings from FIG. 1, the aligned direction of the control terminals 11a to 11f is defined as an X-axis direction, a direction perpendicular to the X-axis direction is defined as a Y-axis direction, and a direction perpendicular to the plane defined by the X-axis direction and the Y-axis direction and corresponding to the upward direction of the semiconductor device according to the embodiment is defined as a Z-axis direction. The sense terminals 12a to 12f and the output terminals 13a to 13f are aligned in line in the X-axis direction. The P terminals 14a and 14b and the N terminals 15a and 15b are aligned in the Y-axis direction on one side of the sealing resin 1 in the longitudinal direction.

A material used for each of the control terminals 11a to 11f, the sense terminals 12a to 12f, the output terminals 13a to 13f, the P terminals 14a and 14b, and the N terminals 15a and 15b may be a conductive material such as copper (Cu) and aluminum (Al). The shape of each of the control terminals 11a to 11f, the sense terminals 12a to 12f, the output terminals 13a to 13f, the P terminals 14a and 14b, and the N terminals 15a and 15b may be a cylindrical shape, or may be any of a prismatic shape, a plate-like shape, or a block-like shape, for example.

Figure 4:
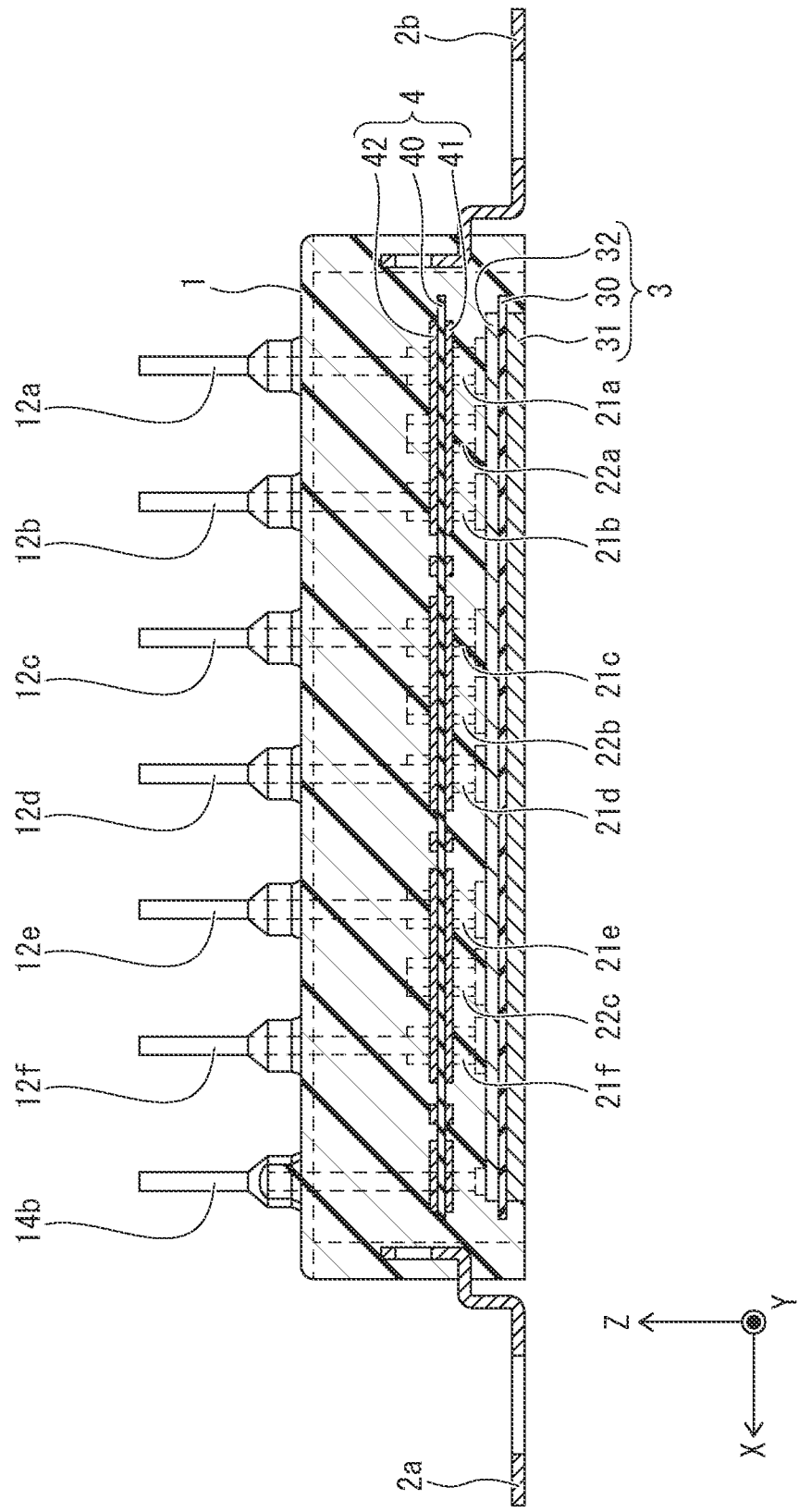
FIG. 4 is a cross-sectional view as viewed from direction A-A in FIG. 3.
Figure 5:
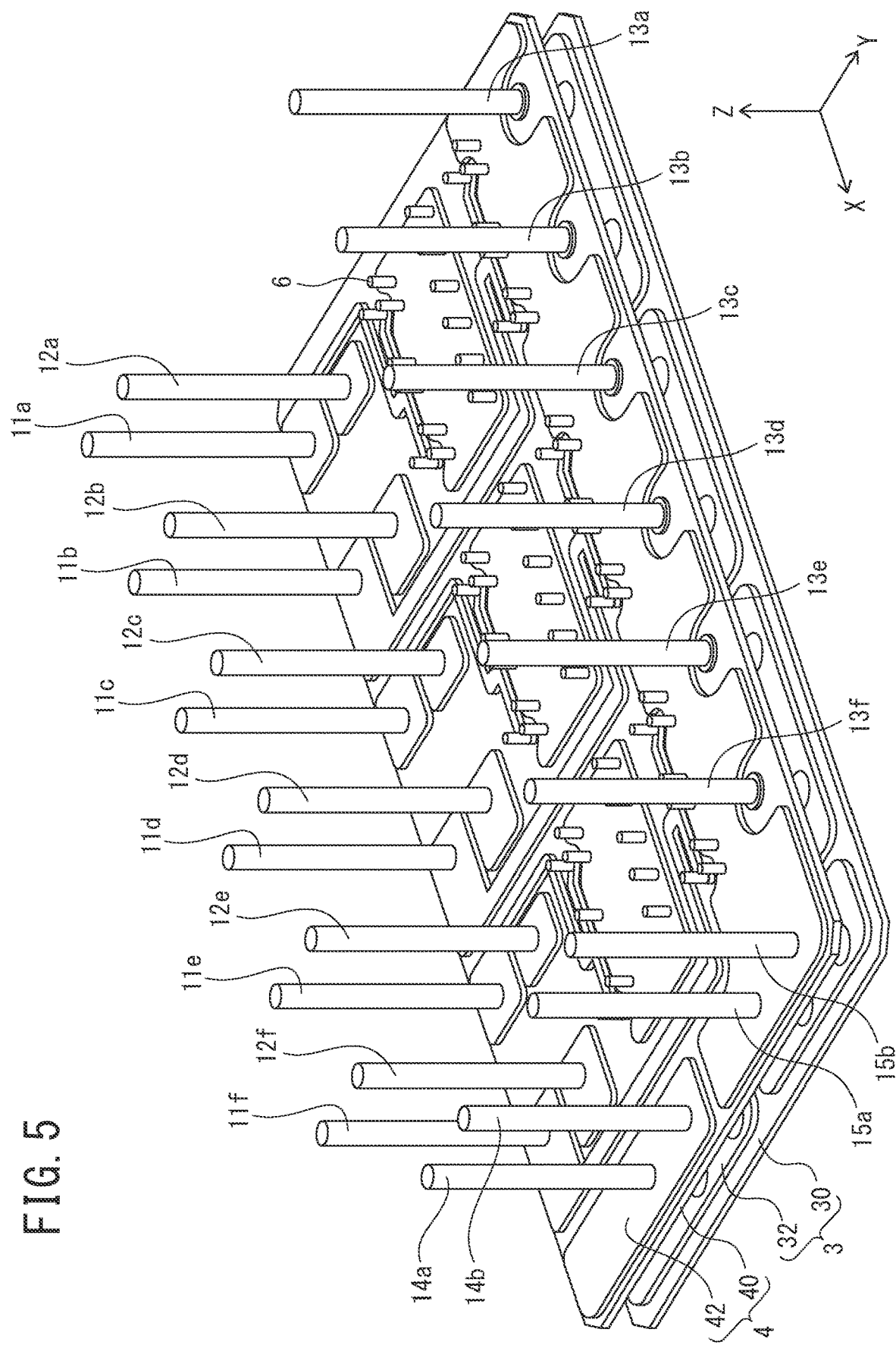
FIG. 5 is a perspective view of the semiconductor device according to the embodiment.

FIG. 4 is a cross-sectional view as viewed from direction A-A in FIG. 3, and FIG. 5 is a perspective view eliminating the illustration of the sealing resin 1 and the attachment flanges 2a and 2b from the semiconductor device illustrated in FIG. 4. As illustrated in FIG. 4 and FIG. 5, the semiconductor device according to the embodiment includes the single insulated circuit board 3, a plurality of power semiconductor chips 21a to 21f and 22a to 22c mounted on the top surface of the insulated circuit board 3, and a printed board 4 arranged over the insulated circuit board 3. The insulated circuit board 3, the semiconductor chips 21a to 21f and 22a to 22c, and the printed board 4 are sealed by the sealing resin 1. The semiconductor device according to the embodiment is a 6-in-1 module using the plural semiconductor chips 21a to 21f and 22a to 22c, the insulated circuit board 3, and the printed board 4 to implement upper and lower arms of a three-phase bridge circuit.

As illustrated in FIG. 4 and FIG. 5, the insulated circuit board 3 may be either a direct bonded copper (DCB) substrate or an active metal brazed (AMB) substrate, for example. The insulated circuit board 3 includes the single insulating substrate 30, the conductive layer 31 deposited on the bottom surface of the insulating substrate 30, and a wiring layer 32 deposited on the top surface of the insulating substrate 30. The insulating substrate 30 may be a ceramic substrate including aluminum oxide ($Al_2O_3$), aluminum nitride (AlN), and silicon nitride ($Si_3N_4$). A material used for the conductive layer 31 and the wiring layer 32 may be a conductive foil such as copper (Cu) or aluminum (Al). While FIG. 4 illustrates the case in which the conductive layer 31 has a greater thickness than the wiring layer 32, the conductive layer 31 may be thinner than the wiring layer 32 or may have the same thickness as the wiring layer 32.

As illustrated in FIG. 4 and FIG. 5, the printed board 4 includes an insulating layer 40, a lower wiring layer 41 deposited on the bottom surface of the insulating layer 40, and an upper wiring layer 42 deposited on the top surface of the insulating layer 40. The insulating layer 40 may include ceramics such as $Al_2O_3$, AlN, or $Si_3N_4$ or resin. The materials used for the sealing resin 1, the insulating layer 40, the lower wiring layer 41, and the upper wiring layer 42 are each determined preferably such that an average coefficient of linear expansion of the sealing resin 1 in a range between a cured temperature and a room temperature is set in a range between an average coefficient of linear expansion of the insulating layer 40 and an average coefficient of linear expansion of the respective lower and upper wiring layers 41 and 42. This can reduce a thermal stress or a warp of the printed board 4 having a greater size than a 2-in-1 module.

The printed board 4 is provided with a plurality of penetration holes (through-holes) penetrating the insulating layer 40, the lower wiring layer 41, and the upper wiring layer 42. The control terminals 11a to 11f, the sense terminals 12a to 12f, the output terminals 13a to 13f, the P terminals 14a and 14b, and the N terminals 15a and 15b are inserted and bonded to the respective penetration holes of the printed board 4. Other plural pins (conductive posts) 6 are also inserted and bonded to the plural penetration holes of the printed board 4.

Figure 6:
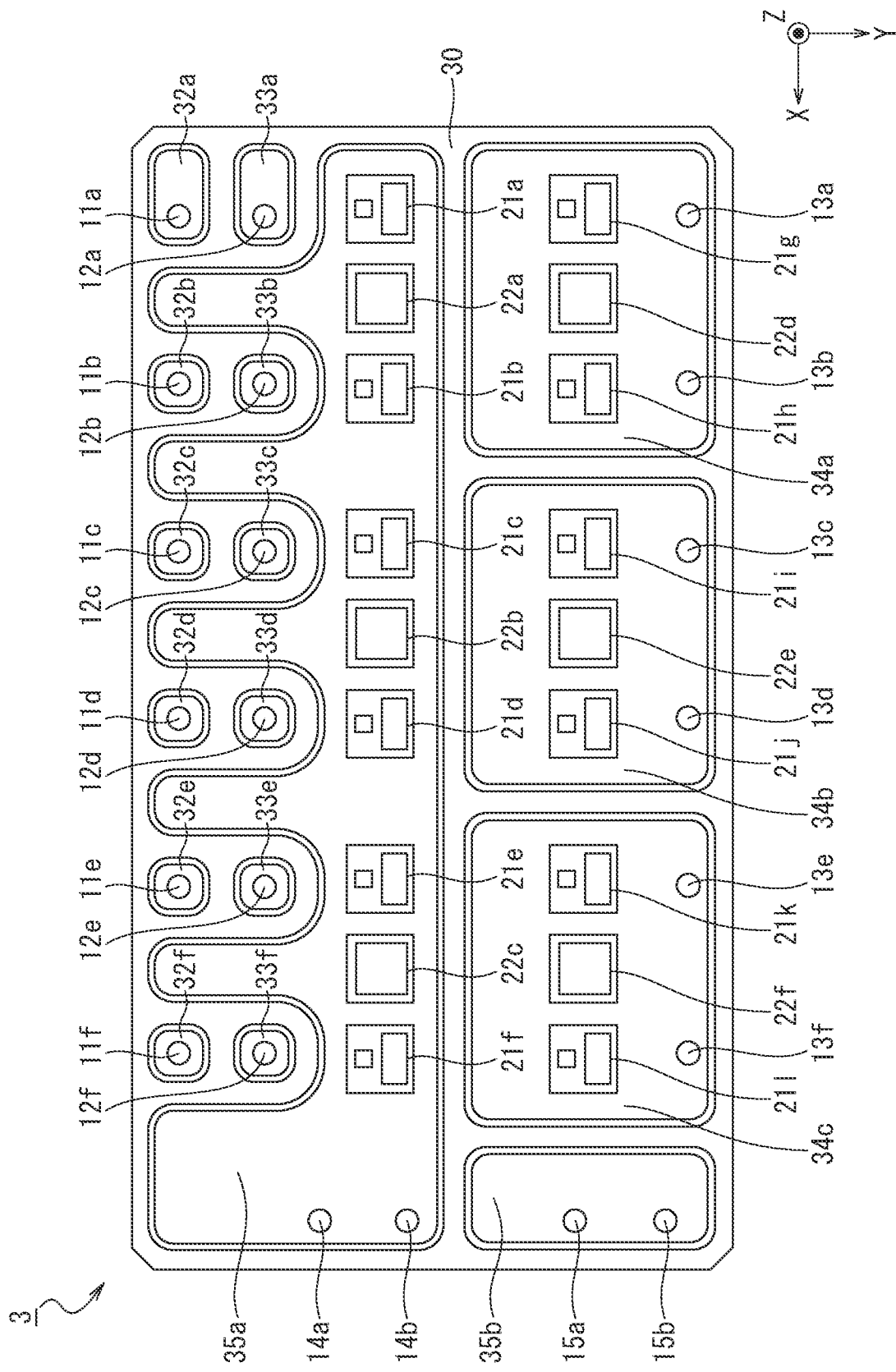
FIG. 6 is a top view illustrating an insulated circuit board of the semiconductor device according to the embodiment.

The wiring layer 32 of the insulated circuit board 3 illustrated in FIG. 4 and FIG. 5 includes a substrate-side common pattern layer (a P terminal connection pattern layer) 35a, an N terminal support pattern layer 35b, six control terminal support pattern layers 32a, 32b, 32c, 32d, 32e, and 32f, six sense terminal support pattern layers 33a, 33b, 33c, 33d, 33e, and 33f, and three output terminal connection pattern layers (first to third pattern layers) 34a, 34b, and 34c, as illustrated in FIG. 6.

The P terminal connection pattern layer 35a has a comb-like pattern layer extending in the X-axis direction. The two P terminals 14a and 14b are bonded to the P terminal connection pattern layer 35a in the vertical direction (the Z-axis direction). The P terminals 14a and 14b are shared by the upper arms for the three phases, and any dedicated wires for connecting three 2-in-1 modules together are thus not required.

The output terminal connection pattern layers 34a to 34c each have a substantially rectangular planar pattern layer, and are aligned in line in the X-axis direction along the P terminal connection pattern layer 35a. The two output terminals (first output terminals) 13a and 13b are bonded to the output terminal connection pattern layer (first pattern layer) 34a in the vertical direction (the Z-axis direction). The two output terminals (second output terminals) 13c and 13d are bonded to the output terminal connection pattern layer (second pattern layer) 34b in the vertical direction (the Z-axis direction). The two output terminals (third output terminals) 13e and 13f are bonded to the output terminal connection pattern layer (third pattern layer) 34c in the vertical direction (the Z-axis direction).

The N terminal support pattern layer 35b has a substantially rectangular planar pattern layer. The two N terminals 15a and 15b are bonded to the N terminal support pattern layer 35b in the vertical direction (the Z-axis direction).

The control terminal support pattern layers 32a to 32f are arranged between the teeth of the comb-shaped pattern of the P terminal connection pattern layer 35a. The control terminal support pattern layers 32a to 32f are aligned in line in the X-axis direction. The control terminals 11a to 11f are each bonded to the corresponding control terminal support pattern layers 32a to 32f in the vertical direction (the Z-axis direction).

The sense terminal support pattern layers 33a to 33f are arranged between the teeth of the comb-shaped pattern of the P terminal connection pattern layer 35a. The sense terminal support pattern layers 33a to 33f are aligned in line parallel to the control terminal support pattern layers 32a to 32f in the X-axis direction. The sense terminals 12a to 12f are each bonded to the corresponding sense terminal support pattern layers 33a to 33f in the vertical direction (the Z-axis direction).

As illustrated in FIG. 6, the semiconductor chips 21a to 21f and 22a to 22c are bonded to the top surface of the P terminal connection pattern layer 35a with bonding members such as solders. The semiconductor chips 21g, 21h, and 22d are bonded to the top surface of the output terminal connection pattern layer 34a with bonding members such as solders. The semiconductor chips 21i, 21j, and 22e are bonded to the top surface of the output terminal connection pattern layer 34b with bonding members such as solders. The semiconductor chips 21k, 21l, and 22f are bonded to the top surface of the output terminal connection pattern layer 34c with bonding members such as solders.

The semiconductor chips 21a to 21l may each be an IGBT, a MOS transistor, an SI thyristor, or a GTO thyristor, for example, and are illustrated herein with a case of the IGBT. The semiconductor chips 21a to 21l may include a silicon (Si) substrate, or may include a wide-bandgap semiconductor substrate including silicon carbide (SiC) or gallium nitride (GaN), for example.

The semiconductor chips 21a to 21l each include an emitter electrode (a first main electrode) and a control electrode (a gate electrode) on the top surface side, and a collector electrode (a second main electrode) on the bottom surface side. The control electrode of the respective semiconductor chips 21a to 21l controls a main current flowing between the first main electrode and the second main electrode of the respective semiconductor chips 21a to 21l.

The respective control electrodes of the semiconductor chips 21a to 21l are electrically connected with the control terminals 11a to 11f via the printed board 4. A predetermined voltage is externally applied to the control electrodes of the semiconductor chips 21a to 21l via the control terminals 11a to 11f. The respective first main electrodes of the semiconductor chips 21a to 21l are electrically connected with the sense terminals 12a to 12f via the printed board 4. The main current flowing between the first main electrode and the second main electrode of the respective semiconductor chips 21a to 21l is externally measured (monitored) via the sense terminals 12a to 12f.

The semiconductor chips 22a to 22f may each be a diode (a two-terminal element) such as a Schottky barrier diode (SBD), and are illustrated herein with a case of the SBD. The semiconductor chips 22a to 22f each include an anode electrode on the bottom surface side and a cathode electrode on the top surface side.

The semiconductor chips 21a, 21b, and 22a implement a circuit on the upper arm side of a U phase (a first phase). The semiconductor chips 21c, 21d, and 22b implement a circuit on the upper arm side of a V phase (a second phase). The semiconductor chips 21e, 21f, and 22c implement a circuit on the upper arm side of a W phase (a third phase). The semiconductor chips 21g, 21h, and 22d implement a circuit on the lower arm side of the U phase. The semiconductor chips 21i, 21j, and 22e implement a circuit on the lower arm side of the V phase. The semiconductor chips 21k, 21l, and 22f implement a circuit on the lower arm side of the W phase. The number of the semiconductor chips for implementing the upper and lower arms of the respective phases can be determined as appropriate.

Figure 7:
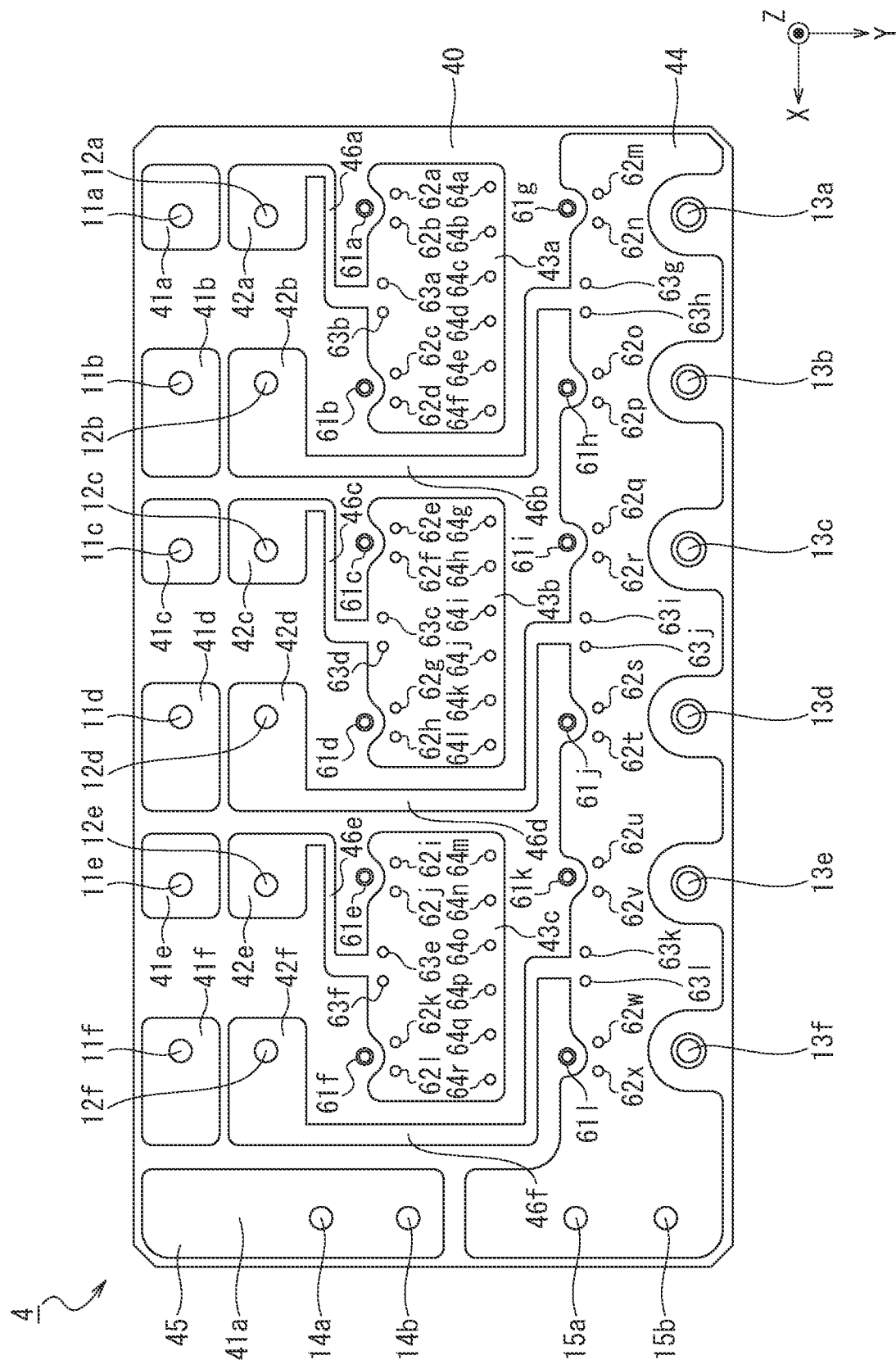
FIG. 7 is a top view illustrating a lower wiring layer of a printed board of the semiconductor device according to the embodiment.

FIG. 7 is a view illustrating the lower wiring layer 41 as viewed from the upper side of the insulating layer 40 of the printed board 4 while omitting the illustration of the upper wiring layer 42 of the printed board 4 illustrated in FIG. 4 and FIG. 5. As illustrated in FIG. 7, the lower wiring layer 41 includes six lower auxiliary pattern layers 41a, 41b, 41c, 41d, 41e, and 41f, six sense terminal connection pattern layers 42a, 42b, 42c, 42d, 42e, and 42f, three lower relay pattern layers 43a, 43b, and 43c, a lower common pattern layer (a lower N terminal connection pattern layer) 44, and a lower P terminal connection pattern layer 45.

The lower auxiliary pattern layers 41a to 41f are aligned in line in the X-axis direction. The control terminals 11a to 11f are inserted and bonded to the respective penetration holes of the lower auxiliary pattern layers 41a to 41f in the vertical direction (the Z-axis direction) perpendicular to the main surface of the respective lower auxiliary pattern layers 41a to 41f.

The sense terminal connection pattern layers 42a to 42f are aligned in line parallel to the lower auxiliary pattern layers 41a to 41f in the X-axis direction. The sense terminals 12a to 12f are inserted and bonded to the respective penetration holes of the sense terminal connection pattern layers 42a to 42f in the vertical direction (the Z-axis direction) perpendicular to the main surface of the respective sense terminal connection pattern layers 42a to 42f.

The lower relay pattern layers 43a to 43c are aligned in line parallel to the lower auxiliary pattern layers 41a to 41f and the sense terminal connection pattern layers 42a to 42f in the X-axis direction. Stick-like main current pins (conductive posts) 62a to 62d, 63a, 63b, and 64a to 64f are inserted and bonded to the respective penetration holes of the lower relay pattern layer 43a in the vertical direction (the Z-axis direction) perpendicular to the main surface of the lower relay pattern layer 43a. The side surfaces of the main current pins 62a to 62d, 63a, 63b, and 64a to 64f are connected to the lower relay pattern layer 43a. Stick-like main current pins (conductive posts) 62e to 62h, 63c, 63d, and 64g to 64l are inserted and bonded to the respective penetration holes of the lower relay pattern layer 43b in the vertical direction (the Z-axis direction) perpendicular to the main surface of the lower relay pattern layer 43b. The side surfaces of the main current pins 62e to 62h, 63c, 63d, and 64g to 64l are connected to the lower relay pattern layer 43b. Stick-like main current pins (conductive posts) 62i to 62l, 63e, 63f, and 64m to 64r are inserted and bonded to the respective penetration holes of the lower relay pattern layer 43c in the vertical direction (the Z-axis direction) perpendicular to the main surface of the lower relay pattern layer 43c. The side surfaces of the main current pins 62i to 62l, 63e, 63f, and 64m to 64r are connected to the lower relay pattern layer 43c.

The respective pairs of the main current pins 62a to 62l are bonded to the first main electrodes of the corresponding semiconductor chips 21a to 21f illustrated in FIG. 6 in the vertical direction (the Z-axis direction). The respective pairs of the main current pins 63a to 63f are bonded to the cathode electrodes of the corresponding semiconductor chips 22a to 22c illustrated in FIG. 6 in the vertical direction (the Z-axis direction). The main current pins 64a to 64f are bonded to the output terminal connection pattern layer 34a illustrated in FIG. 6 in the vertical direction (the Z-axis direction). The main current pins 64g to 64l are bonded to the output terminal connection pattern layer 34b illustrated in FIG. 6 in the vertical direction (the Z-axis direction). The main current pins 64m to 64r are bonded to the output terminal connection pattern layer 34c illustrated in FIG. 6 in the vertical direction (the Z-axis direction).

The lower common pattern layer 44 is arranged to extend parallel to the lower relay pattern layers 43a to 43c in the X-axis direction. The N terminals 15a and 15b and main current pins 62m to 62x and 63g to 63l are inserted and bonded to the respective penetration holes of the lower common pattern layer 44 in the vertical direction (the Z-axis direction) perpendicular to the main surface of the lower common pattern layer 44. The side surfaces of the N terminals 15a and 15b and the side surfaces of the main current pins 62m to 62x and 63g to 63l are connected to an upper common pattern layer 54 and the lower common pattern layer 44. The N terminals 15a and 15b are shared by the lower arms for the three phases, and any dedicated wires for connecting three 2-in-1 modules together are thus not required.

The respective pairs of the main current pins 62m to 62x are bonded to the first main electrodes of the corresponding semiconductor chips 21g to 21l illustrated in FIG. 6 in the vertical direction (the Z-axis direction). The respective pairs of the main current pins 63g to 63l are bonded to the cathode electrodes of the corresponding semiconductor chips 22d to 22f illustrated in FIG. 6 in the vertical direction (the Z-axis direction).

Stick-like control pins 61a to 61l are inserted and bonded to the respective penetration holes in the vertical direction (the Z-axis direction) perpendicular to the main surface in the region in which the insulating layer 40 is exposed on the top surface of the printed board 4. Each of the control pins 61a to 61l is bonded to the control electrode of the respective semiconductor chips 21a to 21l illustrated in FIG. 6 in the vertical direction (the Z-axis direction). The respective output terminals 13a to 13f are inserted and bonded to the penetration holes of the insulating layer 40 in the vertical direction (the Z-axis direction) perpendicular to the main surface.

A material used for the respective control pins 61a to 61l and the respective main current pins 62a to 62x, 63a to 63l, and 64a to 64r may be a conductive material such as Cu and Al. The shape of the respective control pins 61a to 61l and the respective main current pins 62a to 62x, 63a to 63l, and 64a to 64r may be a cylindrical shape, or may be any of a prismatic shape, a plate-like shape, or a block-like shape, for example. The respective control pins 61a to 61l and the respective main current pins 62a to 62x, 63a to 63l, and 64a to 64r may have either the same length or different lengths.

The sense terminal connection pattern layers 42a, 42c, and 42e of the sense terminal connection pattern layers 42a to 42f are connected to the lower relay pattern layers 43a to 43c via sense wires 46a, 46c, and 46e. The sense terminal connection pattern layers 42b, 42d, and 42f are connected to the lower common pattern layer 44 via sense wires 46b, 46d, and 46f. The sense wires 46b and 46d are arranged to pass through the regions between the corresponding lower relay pattern layers 43a to 43c. The sense wire 46f is arranged to pass through the region between the lower relay pattern layer 43c and the lower P terminal connection pattern layer 45. The part of the respective sense wires 46b, 46d, and 46f is arranged to further pass through the region between the corresponding lower relay pattern layers 43a to 43c and the lower common pattern layer 44. The semiconductor device includes the plural sense wires 46a to 46f each electrically connected to one of the semiconductor chips 21a to 21l, and 22a to 22f, and the sense wires 46a to 46f are partly provided in the regions opposed to control wires via the insulating layer 40.

Figure 8:
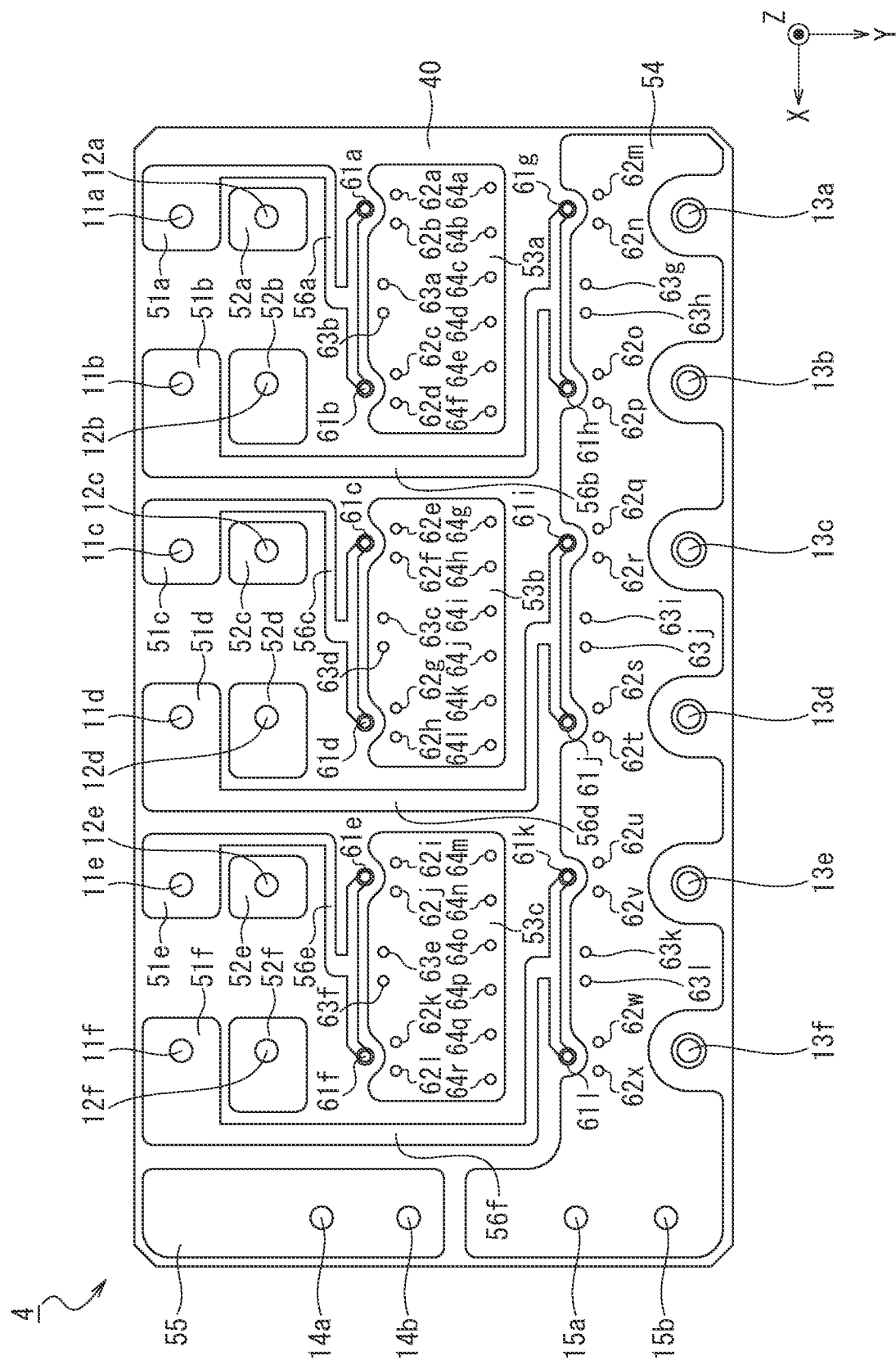
FIG. 8 is a top view illustrating an upper wiring layer of the printed board of the semiconductor device according to the embodiment.

The upper wiring layer 42 of the printed board 4 illustrated in FIG. 4 and FIG. 5 includes six control terminal connection pattern layers 51a, 51b, 51c, 51d, 51e, and 51f, six upper auxiliary pattern layers 52a, 52b, 52c, 52d, 52e, and 52f, three upper relay pattern layers 53a, 53b, and 53c, an upper common pattern layer (an upper N terminal connection pattern layer) 54, and an upper P terminal connection pattern layer 55, as illustrated in FIG. 8.

The control terminal connection pattern layers 51a to 51f are aligned in line in the X-axis direction. The control terminal connection pattern layers 51a to 51f are located in the regions opposed to the lower auxiliary pattern layers 41a to 41f illustrated in FIG. 7 via the insulating layer 40. The control terminals 11a to 11f are inserted and bonded to the respective penetration holes of the corresponding control terminal connection pattern layers 51a to 51f in the vertical direction (the Z-axis direction) perpendicular to the main surface of the respective control terminal connection pattern layers 51a to 51f. The control terminal connection pattern layers 51a to 51f are electrically connected to the lower auxiliary pattern layers 41a to 41f through the control terminals 11a to 11f so as to have the same potential as the lower auxiliary pattern layers 41a to 41f.

The control terminal connection pattern layers 51a to 51f are connected to the control pins 61a to 61l via the control wires 56a to 56f. The control wires 56a to 56f are provided in the regions opposed to the sense wires 46a to 46f illustrated in FIG. 7 via the insulating layer 40. The control wires 56a to 56f are each branched into two parts toward the control pins 61a to 61l, so as to wire the respective pairs of the control pins 61a to 61l with the equal length (isometric wiring). The control wires 56a, 56c, and 56e are arranged to pass through the regions between the upper auxiliary pattern layers 52a to 52f and the upper relay pattern layers 53a to 53c.

The control wire 56b is provided to pass through the region between the upper auxiliary pattern layers 52b and 52c, and further pass through the region between the upper relay pattern layers 53a and 53b. The control wire 56d is provided to pass through the region between the upper auxiliary pattern layers 52d and 52e, and further pass through the region between the upper relay pattern layers 53b and 53c. The control wire 56f is provided to pass through the region between the upper auxiliary pattern layer 52f and the upper P terminal connection pattern layer 55, and further pass through the region between the upper relay pattern layer 53c and the upper P terminal connection pattern layer 55. The control wires 56b, 56d, and 56f are arranged to further pass through the regions between the corresponding upper relay pattern layers 53a to 53c and the upper common pattern layer 54.

The upper auxiliary pattern layers 52a to 52f are aligned in line parallel to the control terminal connection pattern layers 51a to 51f in the X-axis direction. The upper auxiliary pattern layers 52a to 52f are provided to be opposed to the sense terminal connection pattern layers 42a to 42f illustrated in FIG. 7 via the insulating layer 40. The sense terminals 12a to 12f are inserted and bonded to the penetration holes of the corresponding upper auxiliary pattern layers 52a to 52f in the vertical direction (the Z-axis direction) perpendicular to the main surface of the respective upper auxiliary pattern layers 52a to 52f. The upper auxiliary pattern layers 52a to 52f are individually and electrically connected to the sense terminal connection pattern layers 42a to 42f through the sense terminals 12a to 12f so as to have the same potential as the corresponding sense terminal connection pattern layers 42a to 42f.

The upper relay pattern layers 53a to 53c are aligned in line parallel to the upper auxiliary pattern layers 52a to 52f in the X-axis direction. The upper relay pattern layers 53a to 53c are arranged to be opposed to the lower relay pattern layers 43a to 43c illustrated in FIG. 7 via the insulating layer 40. The main current pins 62a to 62l, 63a to 63f, and 64a to 64r are inserted and bonded to the respective penetration holes of the upper relay pattern layers 53a to 53c in the vertical direction (the Z-axis direction) perpendicular to the main surface of the respective upper relay pattern layers 53a to 53c. The side surfaces of the respective main current pins 62a to 62d, 63a, 63b, and 64a to 64f are connected to the upper relay pattern layer 53a and the lower relay pattern layer 43a, the side surfaces of the respective main current pins 62e to 62h, 63c, 63d, and 64a to 64l are connected to the upper relay pattern layer 53b and the lower relay pattern layer 43b, and the side surfaces of the respective main current pins 62i to 62l, 63e, 63f, and 64m to 64r are connected to the upper relay pattern layer 53c and the lower relay pattern layer 43c. The upper relay pattern layers 53a to 53c are individually and electrically connected to the lower relay pattern layers 43a to 43c through the main current pins 62a to 62l, 63a to 63f, and 64a to 64r so as to have the same potential as the corresponding lower relay pattern layers 43a to 43c.

The upper common pattern layer 54 is arranged to extend parallel to the upper relay pattern layers 53a to 53c in the X-axis direction. The upper common pattern layer 54 is located in the region opposed to the lower common pattern layer 44 illustrated in FIG. 7 via the insulating layer 40. The N terminals 15a and 15b and the main current pins 62m to 62x and 63g to 63l are inserted and bonded to the respective penetration holes of the upper common pattern layer 54 in the vertical direction (the Z-axis direction) perpendicular to the main surface of the upper common pattern layer 54. The side surfaces of the N terminals 15a and 15b and the side surfaces of the main current pins 62m to 62x and 63g to 63l are connected to the upper common pattern layer 54 and the lower common pattern layer 44. The upper common pattern layer 54 is electrically connected to the lower common pattern layer 44 through the N terminals 15a and 15b and the main current pins 62m to 62x and 63g to 63l so as to have the same potential as the lower common pattern layer 44.

Figure 9:
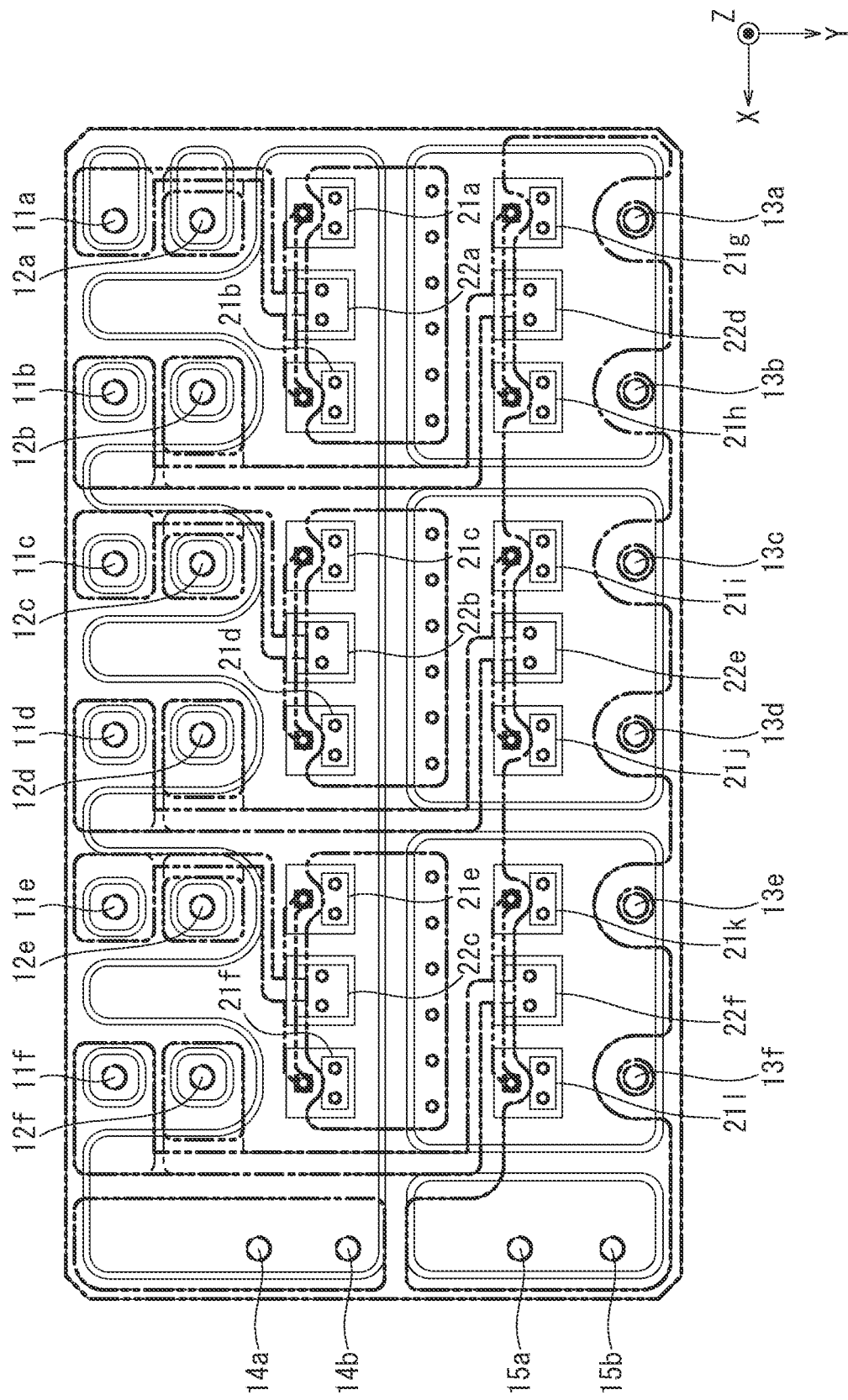
FIG. 9 is a top view illustrating a combination of the insulated circuit board and the upper and lower wiring layers of the printed board of the semiconductor device according to the embodiment superposed on one another.

FIG. 9 is a top view in which the wiring layer 32 illustrated in FIG. 6, the lower wiring layer 41 illustrated in FIG. 7, and the upper wiring layer 42 illustrated in FIG. 8 are superposed on one another. FIG. 9 schematically indicates the wiring layer 32 by the solid line, the lower wiring layer 41 by the dash-dotted line, and the upper wiring layer 42 by the dash-double-dotted line.

Figure 10:
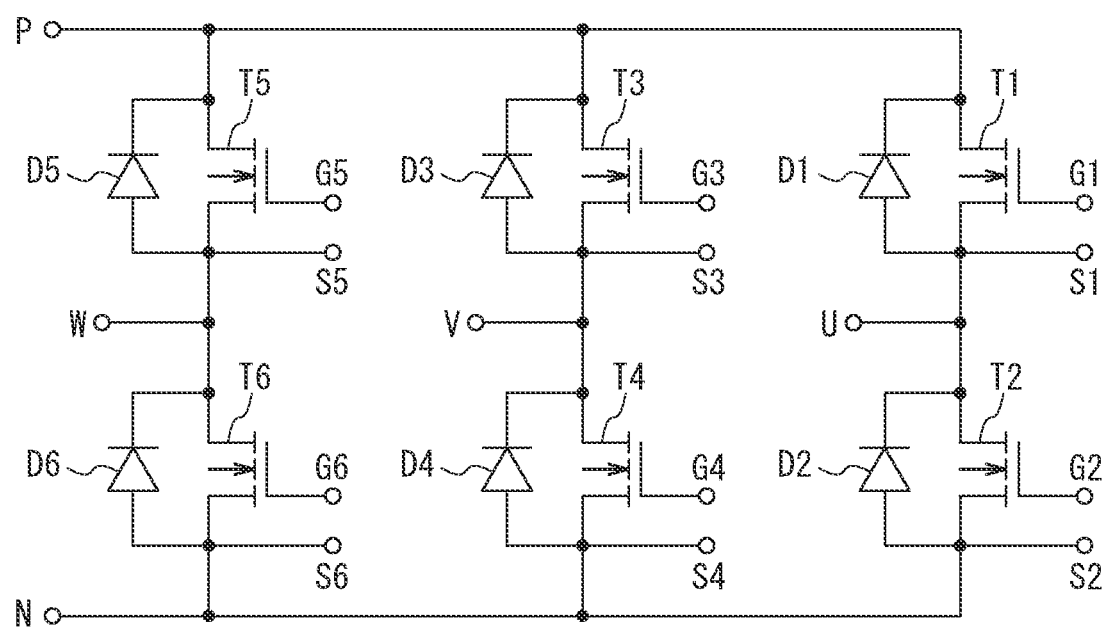
FIG. 10 is an equivalent circuit diagram of the semiconductor device according to the embodiment.

As illustrated in FIG. 10, the semiconductor device according to the embodiment is used for fabricating a three-phase bridge circuit. Drain electrodes (second main electrodes) of MOS transistors T1, T3, and T5 are connected to a P terminal, and source electrodes (first main electrodes) of MOS transistors T2, T4, and T6 are connected to an N terminal. The source electrode of the MOS transistor T1 and the drain electrode of the MOS transistor T2 are connected to an output terminal U and a sense terminal S1. The source electrode of the MOS transistor T3 and the drain electrode of the MOS transistor T4 are connected to an output terminal V and a sense terminal S3. The source electrode of the MOS transistor T5 and the drain electrode of the MOS transistor T6 are connected to an output terminal W and a sense terminal S5. Freewheeling diodes (FWD) D1 to D6 are connected in antiparallel to the MOS transistors T1 to T6. The source electrodes of the MOS transistors T2, T4, and T6 are connected to sense terminals S2, S4, and S6.

The MOS transistor T1 corresponds to the power semiconductor chips 21a and 21b illustrated in FIG. 6, and the freewheeling diode D1 corresponds to the semiconductor chip 22a illustrated in FIG. 6. The MOS transistor T2 corresponds to the power semiconductor chips 21g and 21h illustrated in FIG. 6, and the freewheeling diode D2 corresponds to the semiconductor chip 22d illustrated in FIG. 6.

The MOS transistor T3 corresponds to the power semiconductor chips 21c and 21d illustrated in FIG. 6, and the freewheeling diode D3 corresponds to the semiconductor chip 22b illustrated in FIG. 6. The MOS transistor T4 corresponds to the power semiconductor chips 21i and 21j illustrated in FIG. 6, and the freewheeling diode D4 corresponds to the semiconductor chip 22e illustrated in FIG. 6.

The MOS transistor T5 corresponds to the power semiconductor chips 21e and 21f illustrated in FIG. 6, and the freewheeling diode D5 corresponds to the semiconductor chip 22c illustrated in FIG. 6. The MOS transistor T6 corresponds to the power semiconductor chips 21k and 21l illustrated in FIG. 6, and the freewheeling diode D6 corresponds to the semiconductor chip 22f illustrated in FIG. 6.

<Method of Assembling Semiconductor Device>

An example of a method of assembling the semiconductor device according to the embodiment is described below. First, as illustrated on the lower side of FIG. 11, a single insulated circuit board 3 is prepared. Semiconductor chips 8 are mounted on the top surface of the insulated circuit board 3 via bonding members 7 such as solders. The semiconductor chips 8 illustrated in FIG. 8 correspond to the semiconductor chips 21a to 21l and 22a to 22f illustrated in FIG. 6. Bonding members 9 such as solders are then mounted on the top surface of the insulated circuit board 3 and the top surfaces of the semiconductor chips 21a to 21l and 22a to 22f.

Figure 11:
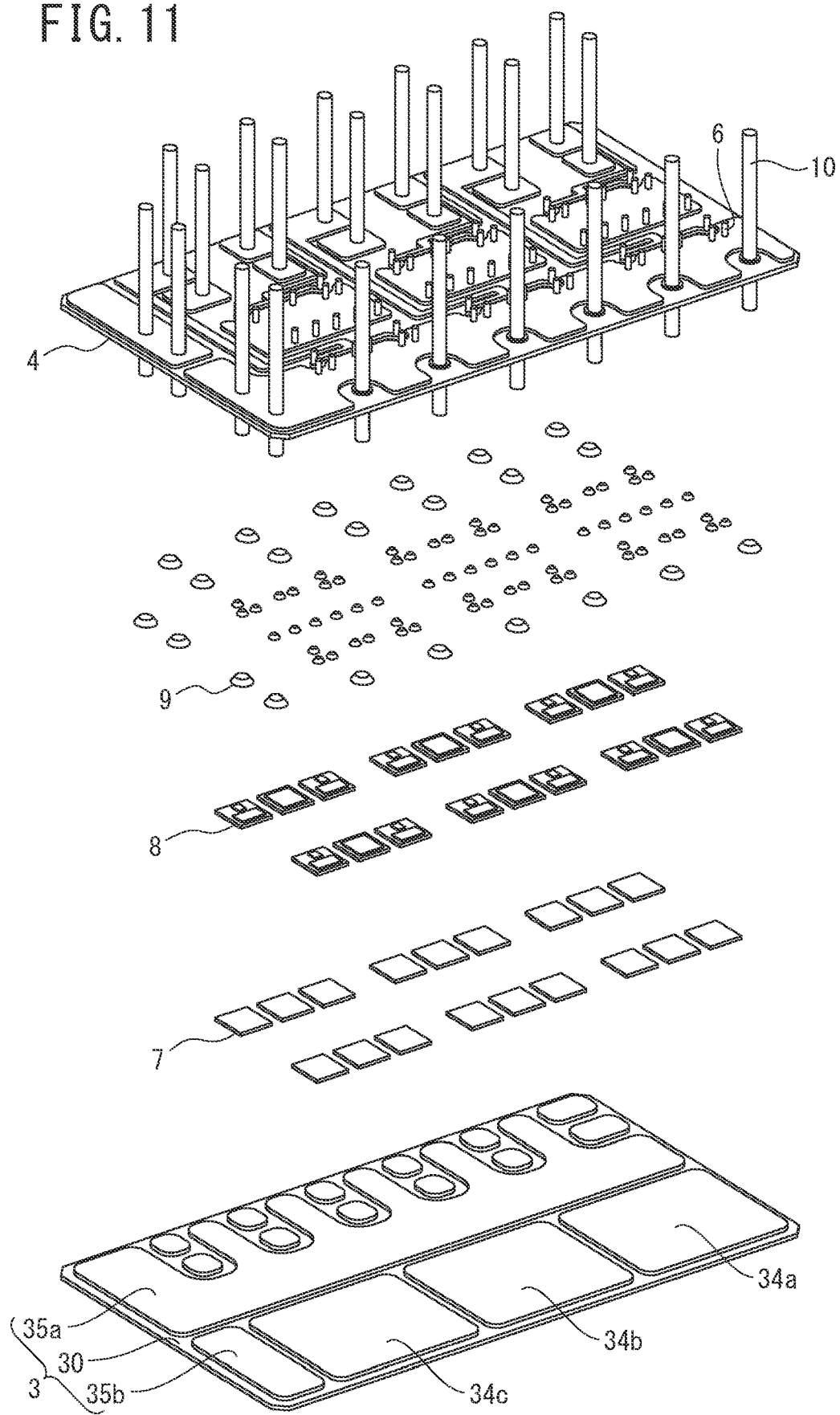
FIG. 11 is a schematic view for explaining a method of assembling the semiconductor device according to the embodiment.

A printed board 4 is prepared such that terminals 10 and pins 6 are inserted by pressure into penetration holes of the printed board 4 in the vertical direction perpendicular to the main surface of the printed board 4 so as to integrate the terminals 10 and the pins 6 with the printed board 4, as illustrated on the upper side of FIG. 11. The terminals 10 illustrated in FIG. 11 correspond to the control terminals 11a to 11f, the sense terminals 12a to 12f, the output terminals 13a to 13f, the P terminals 14a and 14b, and the N terminals 15a and 15b illustrated in FIG. 5. The pins 6 illustrated in FIG. 11 correspond to the control pins 61a to 61l and the main current pins 62a to 62l, 63a to 63f, and 64a to 64r illustrated in FIG. 7 and FIG. 8.

Next, the printed board 4 with the terminals 10 and the pins 6 integrated together is placed on the insulated circuit board 3 on which the bonding members 9 are mounted. These are entirely heated in a heating furnace, for example, to melt and collectively bond the bonding members 7 and 9, so as to obtain the structure illustrated in FIG. 5. Preliminarily subjecting either the printed board 4 or the terminals 10 and the pins 6 inserted by pressure or both of them to tin (Sn) plating or solder plating, leads the plating to be melted during the collective bonding, so as to firmly fix the terminals 10 and the pins 6 together with the penetration holes of the printed board 4.

The bonding members 7 and 9, when made of solder, for example, exert the self-alignment so as to facilitate the connection between the elements. This is derived from the phenomenon in which the semiconductor chips 8 mainly automatically move, since surface tension of the melted solder applied to the pins tends to be balanced in the electrode pads on the semiconductor chips 8. When the bonding members 7 and 9 are made of sintered metal such as silver (Ag) and are thus not melted, an alignment device by image recognition may be used.

Subsequently, the structure illustrated in FIG. 5 is set in a metal mold (not illustrated), and is then molded from resin, as illustrated in FIG. 1 and FIG. 2. To prevent a flow of the resin toward the terminals and the cooling surfaces, the metal mold used for the resin molding may have a structure capable of sandwiching the terminals and the cooling surfaces. The metal mold, particularly when equipped with a slide mechanism for sandwiching the terminals, for example, may be used for molding so as to prevent the terminals from being covered with the resin that hinders the electrical connection. Alternatively, O-rings may be used at the tips of the terminals, for example, so as to impede a flow of the resin. Alternatively, a film of the resin may be pealed by a laser or a mechanical grinding device after the resin molding. The terminals in this case may be preliminarily subjected to nickel (Ni) plating or tin (Sn) plating easy to separate from the resin. When the material easy to separate from the resin is used, the terminals may be provided with mechanical engagement parts such as recesses and projections so as to prevent the terminals from coming out of the module body.

The attachment flanges 2a and 2b are integrally fixed during the resin molding. The attachment flanges 2a and 2b may be subjected to bending processing as necessary after being molded. The attachment flanges 2a and 2b are not limited to the shape illustrated in FIG. 1 and FIG. 2.

Comparative Example

Figure 12:
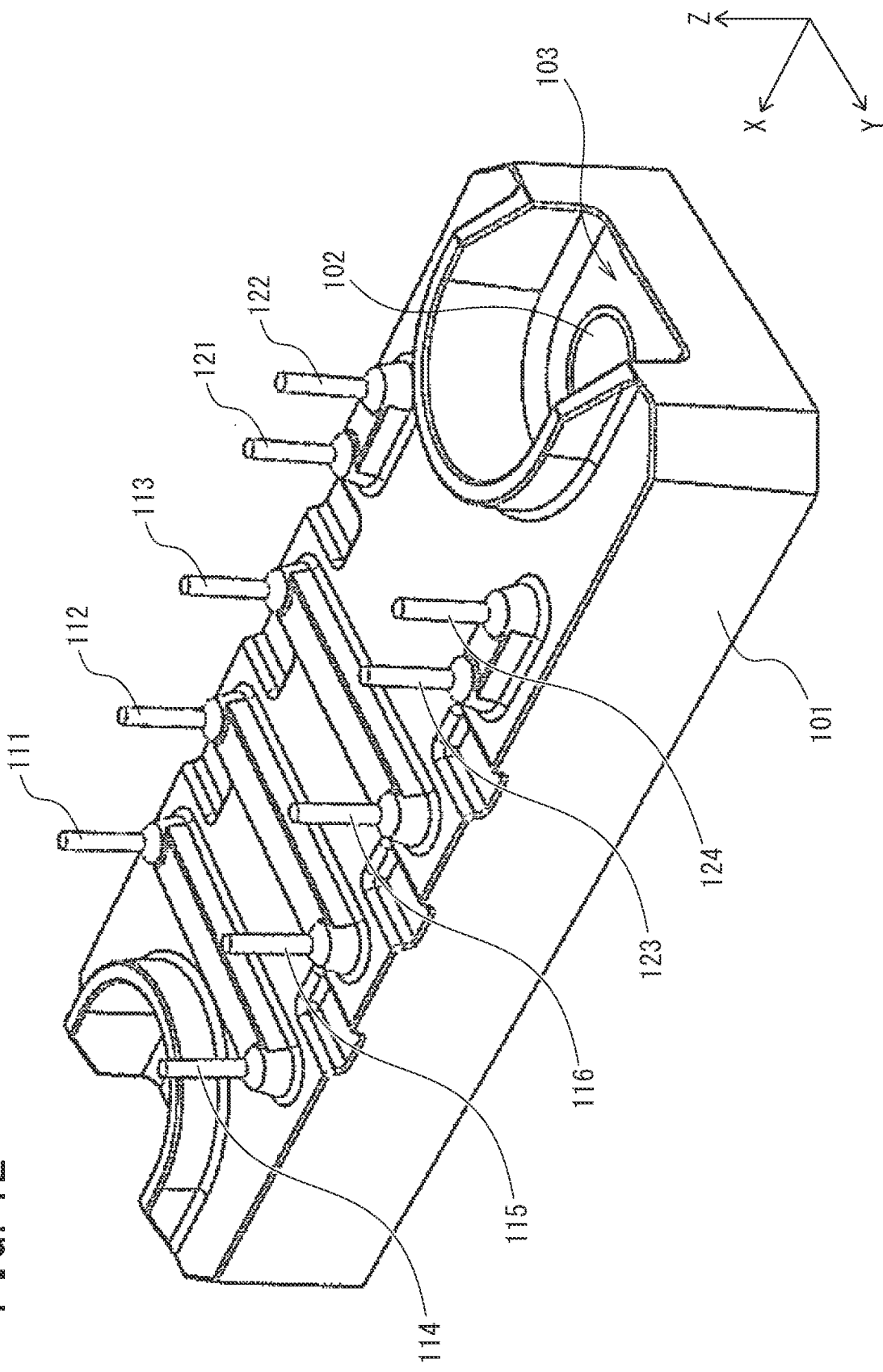
FIG. 12 is a perspective view of a semiconductor device of a comparative example on the top surface side.
Figure 13:
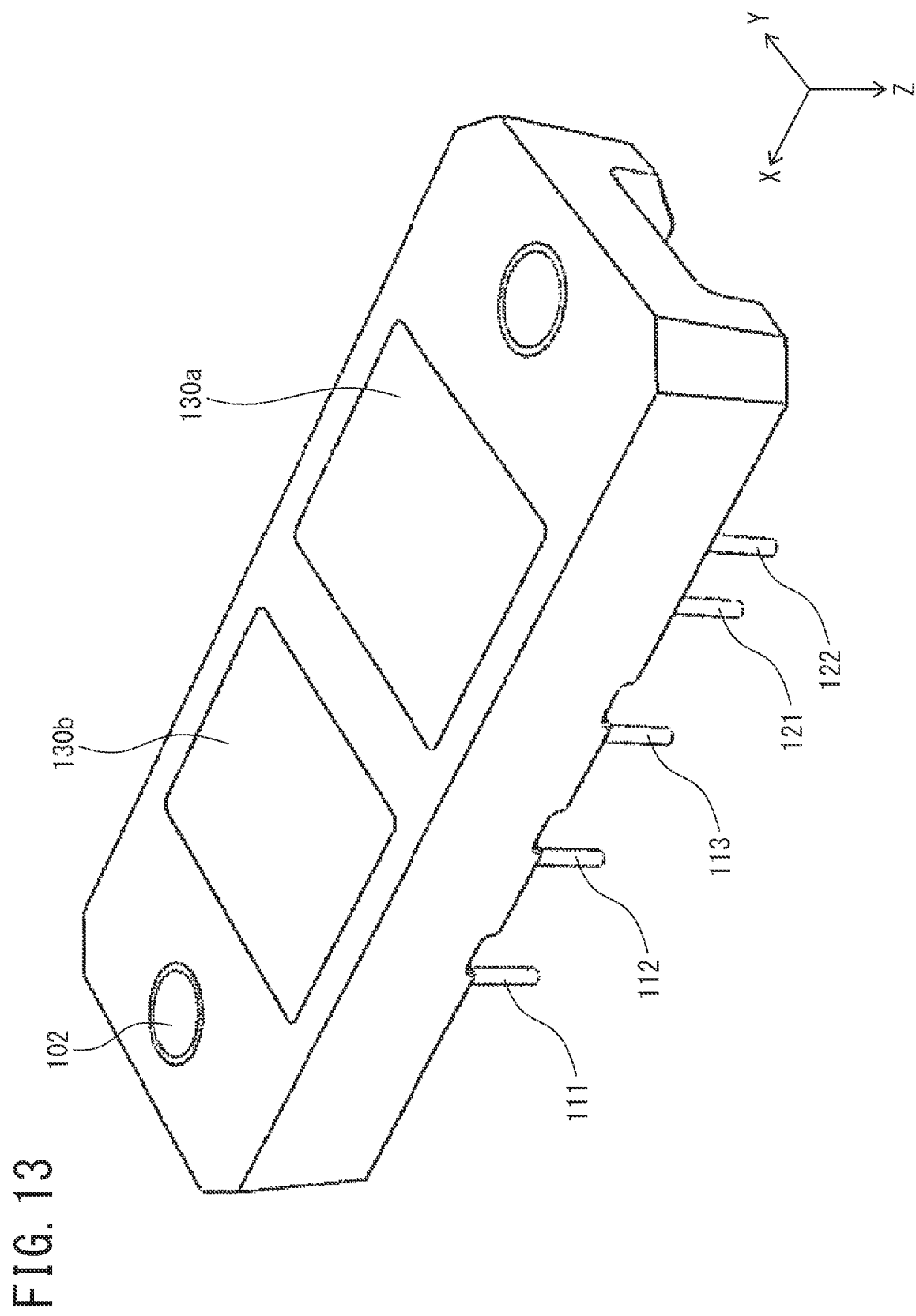
FIG. 13 is a perspective view of the semiconductor device of the comparative example on the bottom surface side.

A semiconductor device of a comparative example is illustrated below with reference to FIG. 12 to FIG. 14. As illustrated in FIG. 12, the semiconductor device of the comparative example includes a sealing resin 101, and main terminals 111 to 116 and auxiliary terminals 121 to 124 projecting from the top surface of the sealing resin 101. As illustrated in FIG. 13, insulated circuit boards 130a and 130b are exposed on the bottom surface of the semiconductor device of the comparative example.

Figure 14:
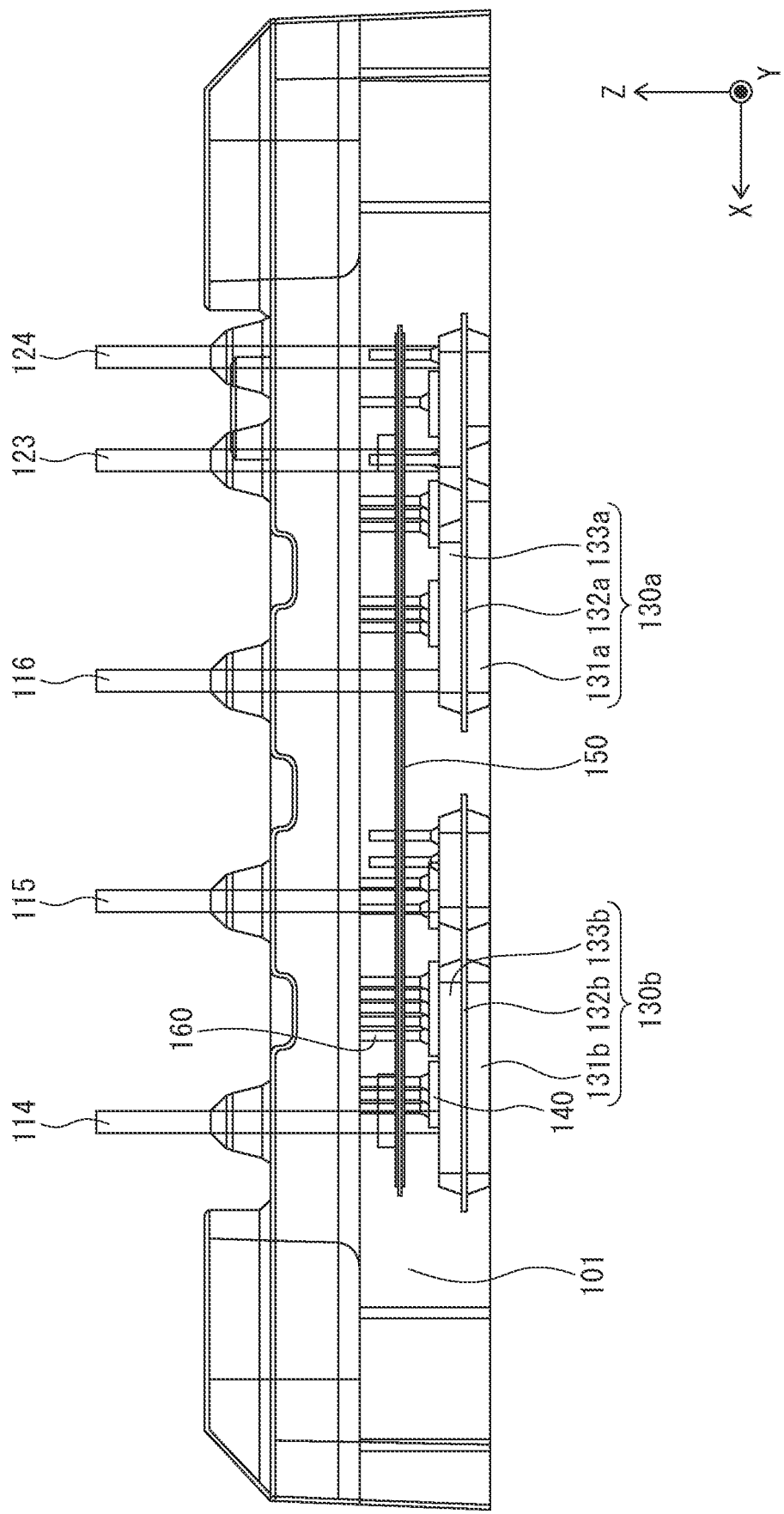
FIG. 14 is a side view of the semiconductor device of the comparative example.

As illustrated in FIG. 14, the semiconductor device of the comparative example includes the two insulated circuit boards 130a and 130b. The insulated circuit board 130a includes an insulating substrate 132a, a conductive layer 131a deposited on the bottom surface of the insulating substrate 132a, and a wiring layer 133a deposited on the top surface of the insulating substrate 132a. The insulated circuit board 130b includes an insulating substrate 132b, a conductive layer 131b deposited on the bottom surface of the insulating substrate 132b, and a wiring layer 133b deposited on the top surface of the insulating substrate 132b.

A plurality of semiconductor chips 140 are mounted on the top surfaces of the two insulated circuit boards 130a and 130b. One ends of a plurality of pins 160 are connected to the top surfaces of the semiconductor chips 140. A printed board 150 is arranged over the insulated circuit boards 130a and 130b. The main terminals 111 to 116 and the auxiliary terminals 121 to 124 penetrate the printed board 150. The other ends of the pins 160 also penetrate the printed board 150.

The semiconductor device of the comparative example is a 2-in-1 module including the semiconductor chips 140 for two circuits. Three modules each using the semiconductor device of the comparative example are thus required so as to implement upper and lower arms for three phases, which increases the number of steps of assembling the device. In addition, the mounted area simply and inevitably needs to be tripled in order to ensure an inter-ground insulating distance of the terminals, ensure a thickness of resin at a frame-like ceramic-exposed part or an edge of the insulating substrate, or ensure an attachment region per module of the semiconductor device of the comparative example. Further, a distance for wiring is increased because of the need for external wiring on the outside of each module of the semiconductor device of the comparative example, resulting in an increase in inductance.

In contrast, the semiconductor device according to the embodiment has the configuration in which the semiconductor chips 21a to 21l and 22a to 22f are held between the single insulated circuit board 3 and the single printed board 4, so as to fabricate an integrated 6-in-1 module for three phases, as illustrated in FIG. 1 to FIG. 9. This configuration can save the respective insulating distances, the exposed part of the insulating substrate, the resin around the exposed part, and a screw-fastened region necessary for each module, as compared with the case in which the three 2-in-1 modules are combined together. In addition, the 6-in-1 module having a smaller size and lower inductance can be provided at lower costs than the case in which the three 2-in-1 modules are mounted.

Further, the arrangement of the lower wiring layer 41 and the upper wiring layer 42 of the printed board 4 opposed to each other with the same potential can reduce floating inductance.

While the arrangement of the lower wiring layer 41 and the upper wiring layer 42 of the printed board 4 opposed to each other reduces the possibility of wiring, the arrangement of the control wires 56b, 56d, and 56f passing through the regions between the upper relay pattern layers 53a to 53c and the upper common pattern layer 54 can shorten the drawing length of the respective control wires 56b, 56d, and 56f, as illustrated in FIG. 8, so as to reduce floating inductance.

Further, as illustrated in FIG. 7, the arrangement of the sense wires 46b, 46d, and 46f passing through the regions between the lower relay pattern layers 43a to 43c and the lower common pattern layer 44 can shorten the drawing length of the respective control wires 46b, 46d, and 46f, so as to reduce floating inductance.

First Modified Example

Figure 15:
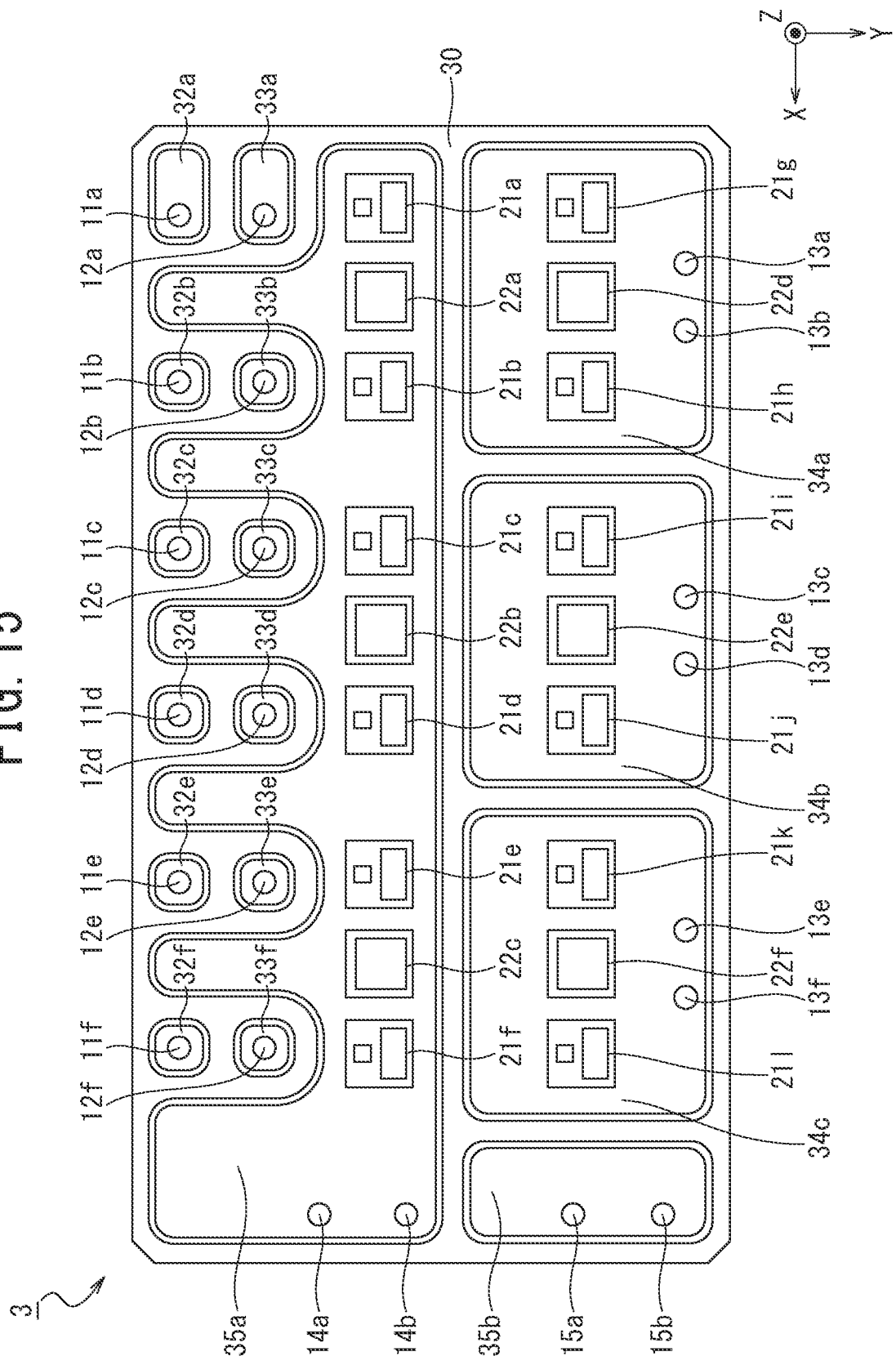
FIG. 15 is a top view illustrating an insulated circuit board of a semiconductor device according to a first modified example of the embodiment.

A semiconductor device according to a first modified example of the embodiment differs from the semiconductor device according to the embodiment in that the positions of the output terminals 13a to 13f in the X-axis direction are shifted from the positions of the control terminals 11a to 11f and the sense terminals 12a to 12f in the X-axis direction, as illustrated in FIG. 15.

The output terminals 13a and 13b are located between a straight line passing through the control terminal 11a and the sense terminal 12a in the Y-axis direction and a straight line passing through the control terminal 11b and the sense terminal 12b in the Y-axis direction. The output terminals 13c and 13d are located between a straight line passing through the control terminal 11c and the sense terminal 12c in the Y-axis direction and a straight line passing through the control terminal 11d and the sense terminal 12d in the Y-axis direction. The output terminals 13e and 13f are located between a straight line passing through the control terminal 11e and the sense terminal 12e in the Y-axis direction and a straight line passing through the control terminal 11f and the sense terminal 12f in the Y-axis direction. The other configurations of the semiconductor device according to the first modified example of the embodiment are the same as those of the semiconductor device according to the embodiment, and overlapping explanations are not repeated below.

The semiconductor device according to the first modified example of the embodiment has the configuration in which the positions of the output terminals 13a to 13f in the X-axis direction are shifted from the positions of the control terminals 11a to 11f and the sense terminals 12a to 12f in the X-axis direction, so as to easily expose the respective terminals when molded with the metal mold equipped with the slide mechanism.

Second Modified Example

Figure 16:
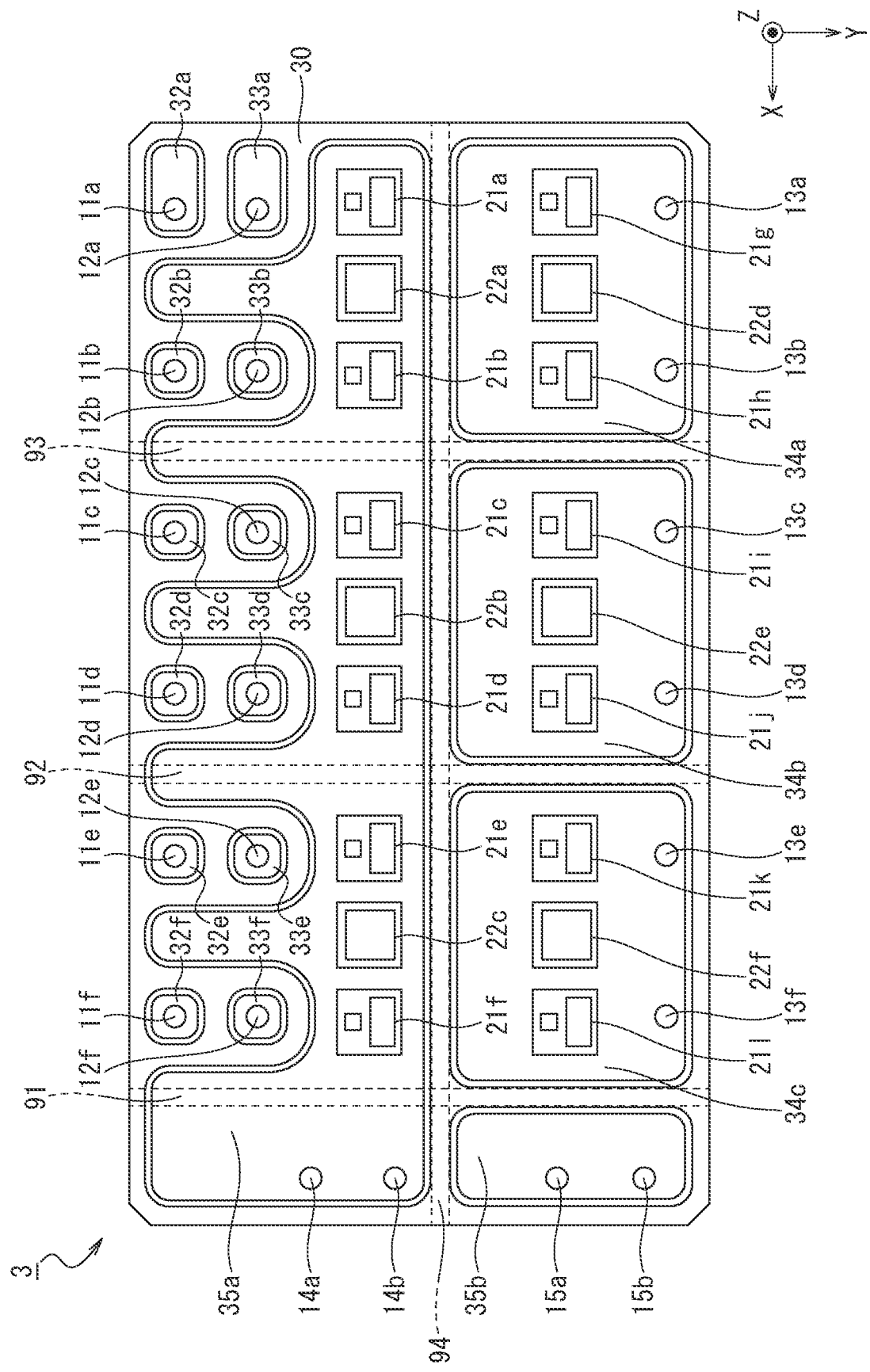
FIG. 16 is a top view illustrating an insulated circuit board of a semiconductor device according to a second modified example of the embodiment.

A semiconductor device according to a second modified example of the embodiment differs from the semiconductor device according to the embodiment in that the conductive layer 31 of the insulated circuit board 3 (refer to FIG. 4) is provided with grooves (slits) 91 to 94 on which the insulating substrate 30 of the insulated circuit board 3 is exposed, as schematically indicated by the broken lines in FIG. 16.

The groove 91 is provided linearly in the Y-axis direction so as to be opposed to the region on which the insulating substrate 30 between the N terminal support pattern layer 35b and the output terminal connection pattern layer 34c is exposed. The groove 92 is provided linearly in the Y-axis direction so as to be opposed to the region on which the insulating substrate 30 between the output terminal connection pattern layers 34b and 34c is exposed. The groove 93 is provided linearly in the Y-axis direction so as to be opposed to the region on which the insulating substrate 30 between the output terminal connection pattern layers 34a and 34b is exposed. The groove 94 is provided linearly in the X-axis direction so as to intersect with the grooves 91 to 93 and to be opposed to the region on which the insulating substrate 30 between the P terminal connection pattern layer 35a and the respective output terminal connection pattern layers 34a to 34c is exposed. The number, the shape, and the arrangement positions of the grooves 91 to 94 are not limited to those illustrated in FIG. 16. The other configurations of the semiconductor device according to the second modified example of the embodiment are the same as those of the semiconductor device according to the embodiment, and overlapping explanations are not repeated below.

The semiconductor device according to the second modified example of the embodiment has the configuration in which the conductive layer 31 of the insulated circuit board 3 is provided with the grooves 91 to 94 on which the insulating substrate 30 of the insulated circuit board 3 is exposed, so as to reduce a warp or a thermal stress of the insulated circuit board 3.

Third Modified Example

Figure 17:
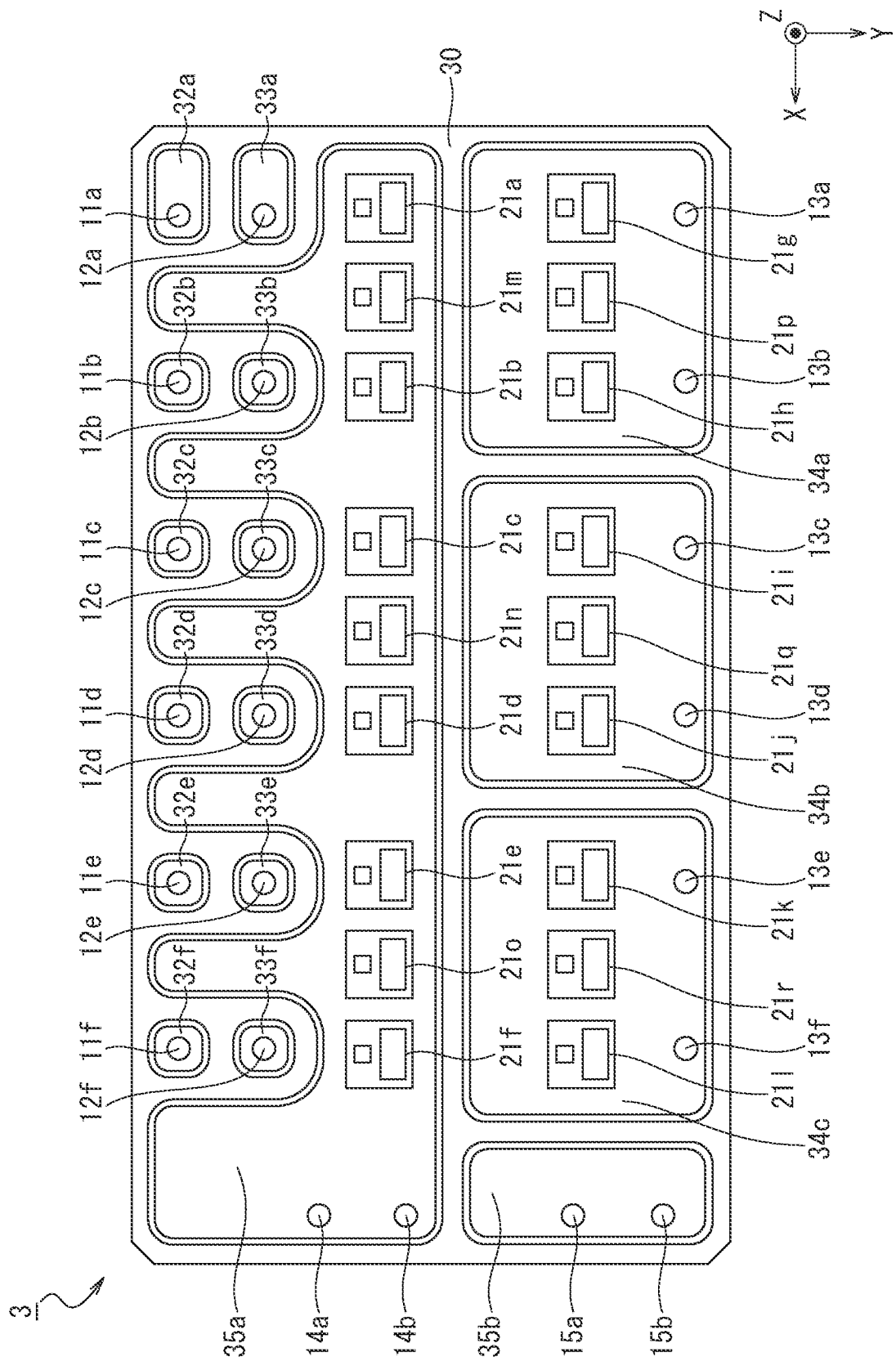
FIG. 17 is a top view illustrating an insulated circuit board of a semiconductor device according to a third modified example of the embodiment.

A semiconductor device according to a third modified example of the embodiment differs from the semiconductor device according to the embodiment in including semiconductor chips 21m to 21r each implementing an IGBT, instead of the semiconductor chips 22a to 22f each implementing the SBD, as illustrated in FIG. 17. The semiconductor chips 21a to 21r each include the SBD.

Figure 18:
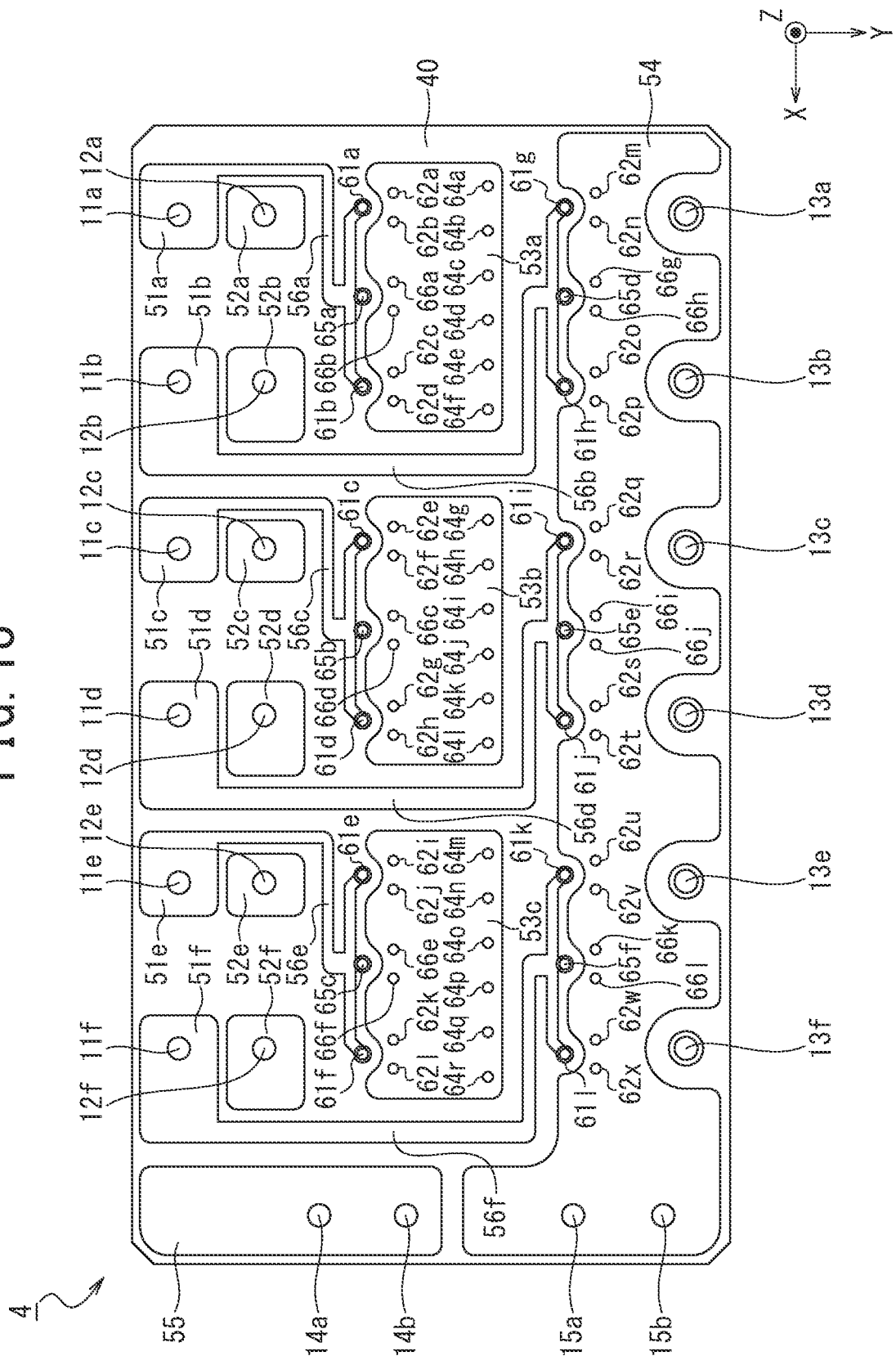
FIG. 18 is a top view illustrating an upper wiring layer of a printed board of the semiconductor device according to the third modified example of the embodiment.

As illustrated in FIG. 18, one end of the respective control wires 56a to 56f is branched into three parts so as to be connected also to control pins 65a to 65f The control wires 56a to 56f do not necessarily wire the respective control pins 61a to 61l and 65a to 65f with the equal length. The control pins 65a to 65f are bonded to the control electrodes of the semiconductor chips 21m to 21r illustrated in FIG. 17. The other configurations of the semiconductor device according to the third modified example of the embodiment are the same as those of the semiconductor device according to the embodiment, and overlapping explanations are not repeated below.

The semiconductor device according to the third modified example of the embodiment does not necessarily include the semiconductor chips implementing the SBDs, which can be embedded in the semiconductor chips 21a to 21r instead.

OTHER EMBODIMENTS

While the present invention has been illustrated by reference to the above embodiment, it should be understood that the present invention is not intended to be limited to the descriptions and the drawings composing part of this disclosure. It will be apparent to those skilled in the art that the present invention includes various alternative embodiments, examples, and technical applications according to the technical idea disclosed in the above embodiments.

While the semiconductor device according to the embodiment has been illustrated with the case in which the sense wires 46a to 46f are provided on the bottom surface side of the printed board 4 as illustrated in FIG. 7, and the control wires 56a to 56f are provided on the top surface side of the printed board 4 as illustrated in FIG. 8, the semiconductor device may have the inverted configuration. Namely, the circuit pattern layer including the sense wires 46a to 46f provided on the bottom surface side of the printed board 4 illustrated in FIG. 7 may be defined on the top surface side, and the circuit pattern layer including the control wires 56a to 56f provided on the top surface side of the printed board 4 illustrated in FIG. 8 may be defined on the bottom surface side.

The control terminals 11a to 11f and the sense terminals 12a to 12f may be arranged reversely. The lower auxiliary pattern layers 41a to 41f and the sense terminal connection pattern layers 42a to 42f illustrated in FIG. 7 are then arranged reversely. In addition, the control terminal connection pattern layers 51a to 51f and the upper auxiliary pattern layers 52a to 52f illustrated in FIG. 8 are also arranged reversely.

Various alternative embodiments, examples, and technical applications will be apparent to those skilled in the art according to the technical idea disclosed in the above embodiment. It should be understood that the present invention includes various embodiments not disclosed herein, such as a configuration to which the respective configurations as described in the above embodiment and the respective modified examples are optionally applied. Therefore, the technical scope of the present invention is defined only by the subject matter according to the claims reasonably derived from the foregoing descriptions.

What is claimed is:

1. A semiconductor device comprising:
   a plurality of semiconductor chips each having a control electrode;
   an insulated circuit board in which the plural semiconductor chips are mounted on one main surface;
   a printed board arranged to be opposed to the one main surface of the insulated circuit board; and
   a plurality of control wires each electrically connected to one of the control electrodes,
   wherein upper and lower arms for three phases are implemented by the semiconductor chips, the insulated circuit board, and the printed board,
   the printed board includes:
   an insulating layer;
   a plurality of upper relay pattern layers arranged on one main surface of the insulating layer;
   an upper common pattern layer arranged parallel to the upper relay pattern layers on the one main surface of the insulating layer;
   a plurality of lower relay pattern layers arranged to be opposed to the upper relay pattern layers on another main surface opposite to the one main surface of the insulating layer and individually having a potential equal to that of the corresponding upper relay pattern layers; and
   a lower common pattern layer arranged to parallel to the lower relay pattern layers to be opposed to the upper common pattern layer on the other main surface of the insulating layer and having a potential equal to that of the upper common pattern layer, and
   the control wires are partly provided in regions between the upper relay pattern layers and the upper common pattern layer or between the lower relay pattern layers and the lower common pattern layer.

2. The semiconductor device of claim 1, further comprising a plurality of sense wires each electrically connected to one of the semiconductor chips, the sense wires being partly provided in regions opposed to the control wires via the insulating layer.

3. The semiconductor device of claim 2, wherein:
   the printed board further includes a plurality of control terminal connection pattern layers arranged parallel to the upper relay pattern layers on the one main surface of the insulating layer; and
   the control wires connect the control terminal connection pattern layers with pins connected to the control electrodes of the semiconductor chips.

4. The semiconductor device of claim 3, wherein:
   the printed board further includes a plurality of upper auxiliary pattern layers between the control terminal connection pattern layers and the upper relay pattern layers on the one main surface of the insulating layer; and
   the control wires pass through regions between the upper auxiliary pattern layers.

5. The semiconductor device of claim 4, wherein:
   the printed board further includes a plurality of sense terminal connection pattern layers arranged parallel to the lower relay pattern layers to be opposed to the upper auxiliary pattern layers on the other main surface of the insulating layer, and having a potential equal to that of the upper auxiliary pattern layers; and the sense wires connect the sense terminal connection pattern layers and the lower common pattern layer.

6. The semiconductor device of claim 5, wherein the printed board further includes, on the other main surface of the insulating layer, a plurality of lower auxiliary pattern layers arranged parallel to the sense terminal connection pattern layers to be opposed to the control terminal connection pattern layers, and having a potential equal to that of the control terminal connection pattern layers.

7. The semiconductor device of claim 6, further comprising:

control terminals penetrating the printed board and connected to the control terminal connection pattern layers and the lower auxiliary pattern layers; and sense terminals penetrating the printed board and connected to the sense terminal connection pattern layers and the upper auxiliary pattern layers.

8. The semiconductor device of claim 1, wherein:

the insulated circuit board includes a first pattern layer, a second pattern layer, a third pattern layer, and a substrate-side common pattern layer;

one main surface of the first pattern layer opposite to the insulated circuit board is provided with the semiconductor chips on a lower arm side for a first phase;

one main surface of the second pattern layer opposite to the insulated circuit board is provided with the semiconductor chips on a lower arm side for a second phase;

one main surface of the third pattern layer opposite to the insulated circuit board is provided with the semiconductor chips on a lower arm side for a third phase;

one main surface of the substrate-side common pattern layer opposite to the insulated circuit board is provided with the semiconductor chips on an upper arm side for the first to third phases;

the semiconductor chips on the lower arm side for the first phase, the semiconductor chips on the lower arm side for the second phase, and the semiconductor chips on the lower arm side for the third phase are electrically connected to the upper common pattern layer and the lower common pattern layer; and the semiconductor chips on the upper arm side for the first to third phases are electrically connected to the respective upper relay pattern layers and the respective lower relay pattern layers.

9. The semiconductor device of claim 8, further comprising:

first main current pins in which side surfaces are connected to the upper relay pattern layers and the lower relay pattern layers, and one ends are each connected to an electrode provided on a maim surface of one of the semiconductor chips toward the printed board on the upper arm side for the first to third phases; and second main current pins in which side surfaces are connected to the upper common pattern layer and the lower common pattern layer, and one ends are each connected to an electrode provided on a maim surface of one of the semiconductor chips toward the printed board on the lower arm side for the first to third phases.

10. The semiconductor device of claim 9, further comprising:

a conductive layer deposited on another main surface opposite to the one main surface of the insulated circuit board;

a first output terminal connected to the one main surface of the first pattern layer;

a second output terminal connected to the one main surface of the second pattern layer;

a third output terminal connected to the one main surface of the third pattern layer;

a high-potential-side terminal conductively connected to the semiconductor chips on the upper arm side;

a low-potential-side terminal conductively connected to the semiconductor chips on the lower arm side; and a sealing resin for sealing the elements excluding one end of the respective first to third output terminals, one end of the respective control terminals, one end of the respective sense terminals, one end of the high-potential-side terminal, one end of the low-potential-side terminal, and a bottom surface of the conductive layer.

\* \* \* \* \*